United States Patent
Miyoshi

(10) Patent No.: US 8,653,665 B2
(45) Date of Patent: Feb. 18, 2014

(54) BARRIER LAYER, FILM FORMING METHOD, AND PROCESSING SYSTEM

(75) Inventor: Hidenori Miyoshi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 19 days.

(21) Appl. No.: 13/378,513

(22) PCT Filed: Jun. 16, 2010

(86) PCT No.: PCT/JP2010/060190
§ 371 (c)(1),
(2), (4) Date: Dec. 15, 2011

(87) PCT Pub. No.: WO2010/147140
PCT Pub. Date: Dec. 23, 2010

(65) Prior Publication Data
US 2012/0091588 A1 Apr. 19, 2012

(30) Foreign Application Priority Data
Jun. 16, 2009 (JP) .................. 2009-142964

(51) Int. Cl.
*H01L 23/48* (2006.01)
(52) U.S. Cl.
USPC ........... 257/751; 257/774; 257/211; 257/762; 438/618; 438/688; 438/563; 438/243; 438/700
(58) Field of Classification Search
USPC ................ 257/751, 774, E23.168, 211, 762, 257/E21.585, E21.584, E21.577; 438/618–688, 563, 243, 700
See application file for complete search history.

(56) References Cited

U.S. PATENT DOCUMENTS

| | | | |
|---|---|---|---|
| 2007/0048931 A1* | 3/2007 | Shimizu et al. | 438/243 |
| 2008/0213998 A1 | 9/2008 | Nagai et al. | |
| 2009/0143890 A1 | 6/2009 | Morisawa | |
| 2009/0218693 A1* | 9/2009 | Lee et al. | 257/751 |
| 2010/0164119 A1* | 7/2010 | Takesako et al. | 257/774 |
| 2010/0233876 A1* | 9/2010 | Matsumoto et al. | 438/652 |

FOREIGN PATENT DOCUMENTS

| | | |
|---|---|---|
| JP | 2001-053030 A | 2/2001 |
| JP | 2004-107747 A | 4/2004 |
| JP | 2005-277390 A | 10/2005 |
| JP | 2007-067107 A | 3/2007 |
| JP | 2008-013848 A | 1/2008 |
| JP | 2008-205177 A | 9/2008 |

(Continued)

OTHER PUBLICATIONS

International Search Report for PCT/JP2010/060190 dated Aug. 24, 2010.

*Primary Examiner* — Steven Loke
*Assistant Examiner* — Junaiden Mirsalahuddin
(74) *Attorney, Agent, or Firm* — Pearne & Gordon LLP

(57) ABSTRACT

There is provided a film forming method for forming a film on a target object having thereon an insulating layer 1 that is made of a low-k film and having a recess 2 whose bottom surface is exposed to a metallic layer 3. The film forming method includes forming a first-metal-containing film containing a first metal such as ruthenium (Ru); and after forming the first-metal-containing film, forming a second-metal-containing film containing a second metal such as a manganese (Mn) having a barrier property against a filling metal to be filled in the recess.

12 Claims, 11 Drawing Sheets

(56) References Cited

FOREIGN PATENT DOCUMENTS

| | | |
|---|---|---|
| JP | 2008-218659 A | 9/2008 |
| JP | 2009-111156 A | 5/2009 |
| WO | 2007/142329 A1 | 12/2007 |
| WO | 2008/015912 A1 | 2/2008 |

* cited by examiner

BARRIER LAYER, FILM FORMING METHOD, AND PROCESSING SYSTEM

TECHNICAL FIELD

The present disclosure relates to a technique for forming a film on a target object, such as a semiconductor wafer, having thereon an insulating layer that is made of a low-k film and having a recess whose bottom is exposed to a metallic layer.

BACKGROUND ART

Generally, semiconductor devices are manufactured by repeatedly performing various processes such as a film forming process or a pattern etching process on a semiconductor wafer. To meet a demand for a higher degree of integration and miniaturization of semiconductor devices, a line width or a hole diameter become gradually reduced. Since it is required to reduce an electrical resistance due to a scaling-down of various dimensions, inexpensive copper having a small electrical resistance tends to be used as a wiring material or a material to be filled in a recess such as a trench or a hole or the like (see, Japanese Patent Laid-open Publication No. 2004-107747). When copper is used as the wiring material or the filling material, generally, a tantalum metal (Ta) film or a tantalum nitride (TaN) film is used as a barrier layer in consideration of its barrier property against copper diffusion to an underlying layer thereof.

In order to fill a recess with the copper, a thin seed film such as a copper film is formed on the entire surface of the wafer including the entire wall of the recess by a plasma sputtering apparatus. Then, the entire surface of the wafer is plated with copper so as to completely fill the recess. Thereafter, remnants of a copper thin film on the surface of the wafer are polished and removed by means of a CMP (Chemical Mechanical Polishing).

Such a process will be explained with reference to FIG. 12. FIG. 12 is a process diagram showing a conventional filling process for a recess of a semiconductor wafer. A recess 2 corresponding to a via hole, a through hole, or a groove (trench) of a single damascene structure, a dual damascene structure, or a three-dimensional package structure is formed on a surface of an insulating layer 1 formed on a semiconductor wafer W. Here, the insulating layer 1 serves as an interlayer insulating film made of, for example, a $SiO_2$ film. Further, an underlying wiring layer 3 made of, for example, copper is exposed to a bottom of the recess 2.

To be specific, the recess 2 includes a groove (trench) 2A having a narrow and long recess shape as a cross sectional shape and a hole 2B formed at a part of a bottom of the groove 2A. This hole 2B becomes a via hole or a through hole. The wiring layer 3 is exposed to a bottom of the hole 2B, and is electrically connected to the underlying wiring layer or an element such as a transistor. Illustration of the underlying wiring layer or the element such as the transistor is omitted. The recess 2 has a very small width or inner diameter such as about 120 nm in order to meet a scaling-down requirement of the design rule. An aspect ratio thereof is required to be, for example, about 2 to about 4. Illustration of a diffusion barrier layer and an etching stop film is omitted, and a simple shape is shown in FIG. 12.

On a surface of this semiconductor wafer W including an inner surface of the recess 2, a barrier layer 4 including, for example, a TaN film and a Ta film in a layered structure is substantially uniformly pre-formed by a plasma sputtering apparatus (see FIG. 12(A)). Then, a seed film 6, made of a thin copper film, as a metal film is formed over the entire surface of the wafer including the inner surface of the recess 2 by the plasma sputtering apparatus (see FIG. 12(B)). By performing a copper plating process on the surface of the wafer, the inside of the recess 2 is filled with a metal film 8 such as a copper film (see FIG. 12 (C)). Thereafter, remnants of the metal film 8, the seed film 6 and the barrier layer 4 on the surface of the wafer are polished and removed by means of the CMP or the like.

In order to increase reliability of the barrier layer, various developments have been made. Particularly, attention is given to a self-forming barrier layer using a Mn film or a CuMn alloy film instead of using the Ta film or the TaN film (see Japanese Patent Laid-open Publication No. 2005-277390). The Mn film or the CuMn alloy film is formed by means of a sputtering method. Further, the Mn film or the CuMn alloy film itself can serve as a seed film. Thus, a Cu plating layer can be directly formed thereon. Further, by performing an annealing process after the plating, the Mn film or the CuMn alloy film reacts with a $SiO_2$ layer as an underlying insulating film by self-alignment. As a result, a MnSixOy film (x, y: a positive number) or a manganese oxide (MnOx) film (x: a positive number) is formed as a barrier layer. The MnSixOy film or the manganese oxide (MnOx) film is formed at a boundary between the $SiO_2$ layer and the Mn film or between the $SiO_2$ layer and the CuMn alloy film. Further, the manganese oxide (MnOx) film is formed by a reaction between Mn and oxygen in the $SiO_2$ layer. As a result, the number of processes can be reduced. The manganese oxide includes MnO, $Mn_3O_4$, $Mn_2O_3$, and $MnO_2$ depending on a valency of Mn. In the present disclosure, these oxides are generally referred to as "MnOx". Further, there has been discussed that a MnSixOy film or a MnOx film is formed by means of a CVD method capable of forming a film having a fine line width or a fine hole diameter with a good step coverage as compared with the sputtering method (see Japanese Patent Laid-open Publication No. 2008-013848).

However, recently, to meet a demand for a higher speed of semiconductor devices, the interlayer insulating film needs to have a lower specific permittivity (relative permittivity). By this demand, there has been considered to use a low-k film as a material of an interlayer insulating film, instead of a silicon oxide film made of TEOS. The low-k film is made of, e.g., SiOC and SiCOH containing an organic group such as a methyl group, and has a lower specific permittivity. Herein, the silicon oxide film made of the TEOS has a specific permittivity of about 4.1, whereas the low-k film made of SiOC has a specific permittivity of about 3.0. However, if the low-k film is used as the interlayer insulating film, a MnOx film is hardly formed thereon even if a process for forming a Mn-containing film is performed by a CVD on a surface of the interlayer insulating film, which has a low specific permittivity, including an exposed surface of the recess. Therefore, a barrier layer cannot be formed thereon.

DISCLOSURE OF THE INVENTION

The present disclosure provides a technique for efficiently forming a thin film having a barrier property on a target object having thereon an insulating layer that is made of a low-k film and having a recess whose bottom is exposed to (is exposed at) a metallic layer.

The present inventors have researched a method of forming a Mn-containing film such as Mn or MnOx on a surface of an insulating layer having a low specific permittivity. As a result of the research, by forming a metal film, made of a Ru film, serving as an underlying film on the surface of the insulating layer before forming the Mn-containing film, the Mn-containing film can be formed efficiently. The present disclosure is based on this result of the research.

In accordance with a first aspect of the present disclosure, there is provided a film forming method for forming a film on a target object having thereon an insulating layer that is made of a low-k film and having a recess whose bottom surface is exposed to a metallic layer. The film forming method includes forming a first-metal-containing film containing a first metal; and after forming the first-metal-containing film, forming a second-metal-containing film containing a second metal having a barrier property against a filling metal to be filled in the recess. Here, the second metal may be Mn.

In the film forming method, the forming a first-metal-containing film and the forming a second-metal-containing film may be performed alternately, and, in addition to the alternate formations, the forming a first-metal-containing film may be additionally performed.

In the film forming method, the forming a first-metal-containing film may be performed and, subsequently, the forming a second-metal-containing film may be performed in a same processing chamber.

In accordance with a second aspect of the present disclosure, there is provided a film forming method for forming a film on a target object having thereon an insulating layer that is made of a low-k film and having a recess whose bottom is exposed to a metallic layer. The film forming method includes forming an alloy film containing a first metal, a second metal having a barrier property against a filling metal to be filled in the recess, and a third metal as a material of the filling metal. Here, the second metal may be Mn.

The film forming method may further include filling the recess with the filling metal.

In the film forming method, the low-k film may be made of one or more films selected from a group consisting of a SiOC film, a SiCOH film, a SiCN film, a porous silica film, a porous methyl silsesquioxane film, a polyallylene film, a SiLK (registered trademark) film, and a fluorocarbon film.

In the film forming method, the first metal may be made of one or more elements selected from a group consisting of Ru, Fe, Co, Ni, Rh, Pd, Os, Ir, Pt, Ti, Ta, Zr, W, Al, V, and Cr.

In the film forming method, one or more compounds selected from a group consisting of $Cp_2Mn[=Mn(C_5H_5)_2]$, $(MeCp)_2Mn[=Mn(CH_3C_5H_4)_2]$, $(EtCp)_2Mn[=Mn(C_2H_5C_5H_4)_2]$, $(i-PrCp)_2Mn[=Mn(C_3H_7C_5H_4)_2]$, $MeCpMn(CO)_3[=(CH_3C_5H_4)Mn(CO)_3]$, $(t-BuCp)_2Mn[=Mn(C_4H_9C_5H_4)_2]$, $CH_3Mn(CO)_5$, $Mn(DPM)_3[=Mn(C_{11}H_{19}O_2)_3]$, $Mn(DMPD)(EtCp)[=Mn(C_7H_{11}C_2H_5C_5H_4)]$, $Mn(acac)_2[=Mn(C_5H_7O_2)_2]$, $Mn(DPM)_2[=Mn(C_{11}H_{19}O_2)_2]$, $Mn(acac)_3[=Mn(C_5H_7O_2)_3]$, $Mn(hfac)_2[=Mn(C_5HF_6O_2)_3]$, $((CH_3)_5Cp)_2Mn[=Mn((CH_3)_5C_5H_4)_2]$, $[Mn(iPr-AMD)_2][=Mn(C_3H_7NC(CH_3)NC_3H_7)_2]$, and $[Mn(tBu-AMD)_2][=Mn(C_4H_9NC(CH_3)NC_4H_9)_2]$ may be used as materials in the forming a second-metal-containing film.

In the film forming method, the filling metal may be copper.

In accordance with a third aspect of the present disclosure, there is provided a barrier layer formed in a recess of a target object having thereon an insulating layer that is made of a low-k film and having the recess whose bottom is exposed to a metallic layer. The barrier layer is positioned below a filling metal to be filled in the recess. The barrier layer includes a first-metal-containing film containing a first metal; and a second-metal-containing film containing a second metal having a barrier property against the filling metal to be filled in the recess. Here, the second metal may be Mn.

In the barrier layer, the first-metal-containing film and the second-metal-containing film may be layered alternately, and an uppermost film may be the first-metal-containing film.

In accordance with a fourth aspect of the present disclosure, there is provided a barrier layer formed in a recess of a target object having thereon an insulating layer that is made of a low-k film and having the recess whose bottom is exposed to a metallic layer. The barrier layer is positioned below a filling metal to be filled in the recess. The barrier layer includes an alloy film containing a first metal, a second metal having a barrier property against the filling metal to be filled, and a third metal as a material of the filling metal to be filled. Here, the second metal may be Mn.

In accordance with a fifth aspect of the present disclosure, there is provided a processing system for forming a film on a target object having thereon an insulating layer that is made of a low-k film and having a recess whose bottom is exposed to a metallic layer. The processing system includes a processing apparatus configured to form a first-metal-containing film containing a first metal on the surface of the target object; a processing apparatus configured to form, on the surface of the target object, a second-metal-containing film containing Mn as a second metal having a barrier property against a filling metal to be filled in the recess; a processing apparatus configured to form a thin film made of a third metal as the filling metal on the surface of the target object; a common transfer chamber connected with each of the processing apparatuses; a transfer unit, provided within the common transfer chamber, for transferring the target object into each of the processing apparatuses; and a system controller that controls the whole processing system so as to perform the film forming method in accordance with the first aspect of the present disclosure.

In accordance with a sixth aspect of the present disclosure, there is provided a processing system for forming a film on a target object having thereon an insulating layer that is made of a low-k film and having a recess whose bottom is exposed to a metallic layer. The processing system includes a processing apparatus configured to form, on the surface of the target object, a first-metal-containing film containing a first metal and form a second-metal-containing film containing Mn as a second metal having a barrier property against a filling metal to be filled in the recess; a processing apparatus configured to form, on the surface of the target object, a thin film made of a third metal as the filling metal to be filled; a common transfer chamber connected with each of the processing apparatuses; a transfer unit, provided within the common transfer chamber, for transferring the target object into each of the processing apparatuses; and a system controller that controls the whole processing system so as to perform the film forming method in accordance with the first aspect of the present disclosure.

In accordance with a seventh aspect of the present disclosure, there is provided a processing system for forming a film on a target object having thereon an insulating layer that is made of a low-k film and having a recess whose bottom is exposed to a metallic layer. The processing system includes a processing apparatus configured to form an alloy film containing a first metal, Mn as a second metal having a barrier property against a filling metal to be filled in the recess, and a third metal as a material of the filling metal to be filled; a common transfer chamber connected with the processing apparatus; a transfer unit, provided within the common transfer chamber, for transferring the target object into the processing apparatus; and a system controller that controls the whole processing system so as to perform the film forming method in accordance with the second aspect of the present disclosure.

BEST MODE FOR CARRYING OUT THE INVENTION

Hereinafter, a barrier layer, a film forming method and a processing system in accordance with embodiments of the present disclosure will be described in detail with reference to the accompanying drawings.
<Processing System>

Figure 1:
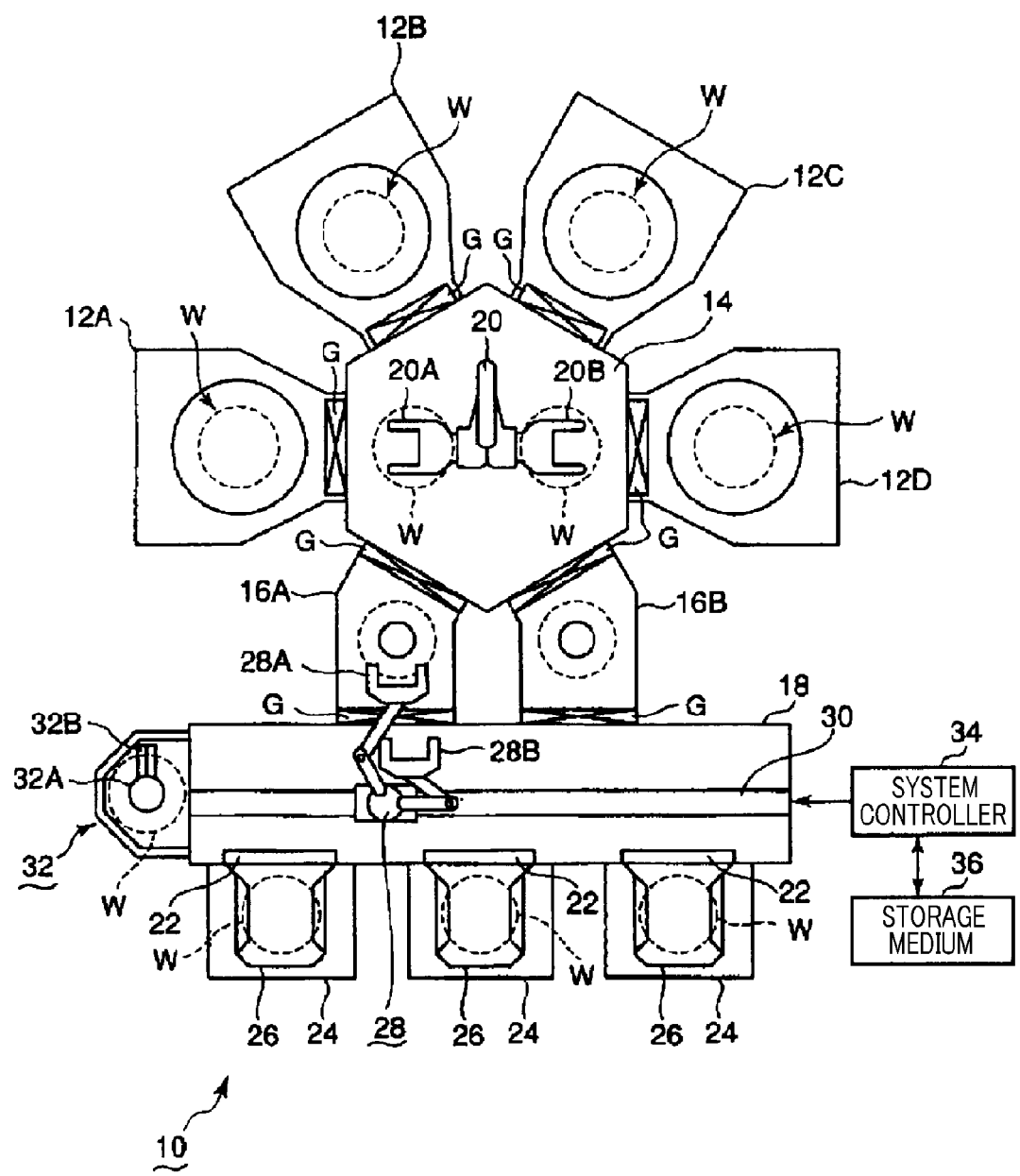
FIG. 1 is a schematic configuration view showing a processing system in accordance with a first embodiment of the present disclosure.
Figure 2:
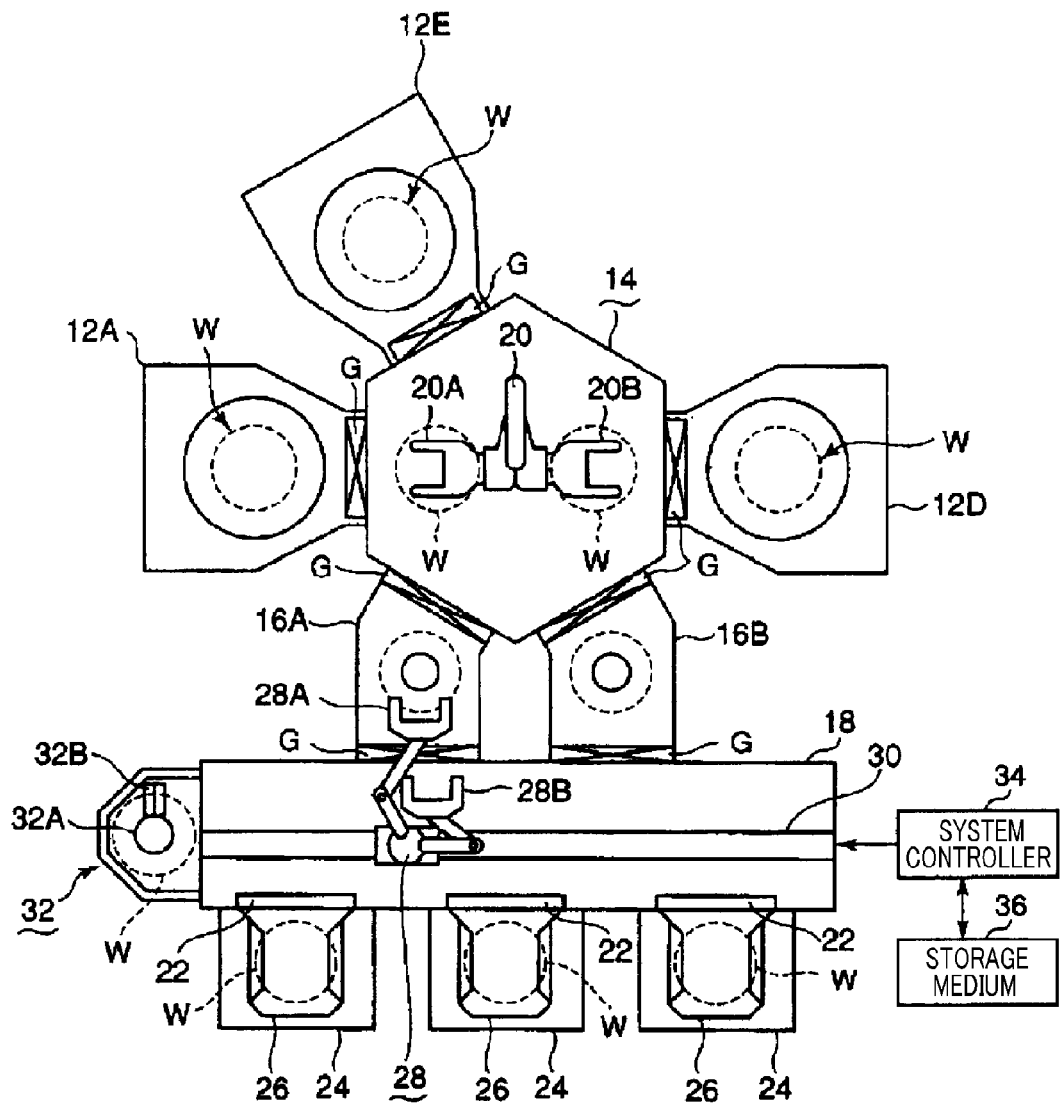
FIG. 2 is a schematic configuration view showing the processing system in accordance with a second embodiment of the present disclosure.

A processing system for performing a film forming method in accordance with an embodiment of the present disclosure will be explained. FIG. 1 is a schematic configuration view showing a processing system in accordance with a first embodiment of the present disclosure, and FIG. 2 is a schematic configuration view showing a processing system in accordance with a second embodiment of the present disclosure.

In the first embodiment, as depicted in FIG. 1, a processing system 10 may include a multiple number of, e.g., four, processing apparatuses 12A, 12B, 12C, and 12D; a common transfer chamber 14 having a substantially hexagonal shape; first and second load lock chambers 16A and 16B each having a load lock function; and an inlet side transfer chamber 18 extended longitudinally.

A first processing apparatus (e.g., the processing apparatus 12A) of the four processing apparatuses 12A to 12D is configured to perform a pre-treatment on a semiconductor wafer as a target object. A second processing apparatus (e.g., the processing apparatus 12B) is configured to form, on the semiconductor wafer W, a first-metal-containing film containing a first metal such as Ru. Further, A third processing apparatus (e.g., the processing apparatus 12C) is configured to form, on the semiconductor wafer W, a second-metal-containing film containing a second metal such as Mn having a barrier property against a filling metal, which will be described later, to be filled in a recess of the wafer. A fourth processing apparatus (e.g., the processing apparatus 12D) is configured to form, on the semiconductor wafer W, a film made of a third metal such as copper, serving as a material of the filling metal.

The first and the fourth processing apparatuses 12A and 12D may not be provided in this processing system 10. Other processing apparatuses provided outside the processing system 10 may perform each process of the first and the fourth processing apparatuses. As the first processing apparatus 12A, a typical cleaning apparatus may be used. As the fourth processing apparatus 12D, a thermal film forming processing apparatus for performing a thermal CVD process may be used.

To be specific, the processing apparatuses 12A to 12D are respectively connected to four sides of the common transfer chamber 14 having a substantially hexagonal shape. The first and the second load lock chambers 16A and 16B are respectively connected to the other two sides. Further, the first and the second load lock chambers 16A and 16B are commonly connected to the inlet side transfer chamber 18.

The common transfer chamber 14 is airtightly connected to each of the four processing apparatuses 12A to 12D and each of the first and the second load lock chambers 16A and 16B via an openable/closable gate valve G. With this configuration, these components may serve as cluster tools. If necessary, the inside of the common transfer chamber 14 communicates with the four processing apparatuses 12A to 12D and the first and the second load lock chambers 16A and 16B, respectively. Here, the inside of the common transfer chamber 14 may be vacuum-exhausted. Further, the inlet side transfer chamber 18 is airtightly connected to each of the first and the second load lock chambers 16A and 16B via an openable/closable gate valve G. The first and the second load lock chambers 16A and 16B are repeatedly changed between a vacuum state and an atmospheric state according to the loading and the unloading of the wafer.

Within the common transfer chamber 14, a transfer device 20 having a contractible-extendible/rotatable multi-joint arm is provided at a position accessible to each of the two load lock chambers 16A and 16B and the four processing apparatuses 12A to 12D. The transfer device 20 includes two picks 20A and 20B which are independently contractible and extensible in mutually opposite directions. The transfer device 20 may handle two wafers at a time. Alternatively, the transfer device 20 may include one pick.

The inlet side transfer chamber 18 may have a box shape elongated in a lateral direction. On one side (longitudinal side) of the box shaped inlet side transfer chamber 18, one or more (for example, three in the drawing) loading openings are provided to load the semiconductor wafer as the target object. At each of the loading openings, an opening/closing door 22, which can be opened and closed, may be provided. A loading port 24 corresponding to each of the loading openings is formed. A single cassette container 26 is mounted on each of the loading ports 24. Each of the cassette containers 26 accommodates a multiple number of, for example, twenty five wafers W by respectively mounting the wafers W in multi-layers with a same pitch. The inside of the cassette container 26 may be in, for example, a sealed state and may be filled with an atmosphere of an inert gas such as a $N_2$ gas.

Within the inlet side transfer chamber 18, an inlet side transfer device 28 for transferring the wafer W in its longitudinal direction is provided. The inlet side transfer device 28 includes two contractible-extendible/rotatable picks 28A and 28B. The inlet side transfer device 28 handles two wafers W at a time. The inlet side transfer device 28 is supported so as to be slidably moved on a guide rail 30 provided to be elongated in its longitudinal direction within the inlet side transfer chamber 18.

At one end of the inlet side transfer chamber 18, an orienter 32 for aligning a position of the wafer is provided. The orienter 32 includes a rotatable table 32A to be rotated by a driving motor while the wafer W is mounted thereon. At an outer periphery of the rotatable table 32A, an optical sensor 32B for detecting a periphery of the wafer W is provided. The optical sensor 32B detects a position of an aligning mark, for example, a notch or an orientation flat, of the wafer W or a misalignment amount of a center of the wafer W.

The processing system 10 includes a system controller 34 including, e.g., a computer, for controlling the whole operation of the processing system. A program required to control the whole operation of the processing system is stored in a storage medium 36 such as a flexible disk, a CD (Compact Dick), a hard disk, or a flash memory. To be specific, in response to instructions from the system controller 34, a supply of each gas may be started or stopped, a flow rate of each gas may be controlled, a process temperature (wafer temperature) and a process pressure (internal pressure of a processing chamber in each processing apparatus) may be controlled, and a wafer may be transferred.

Figure 12:
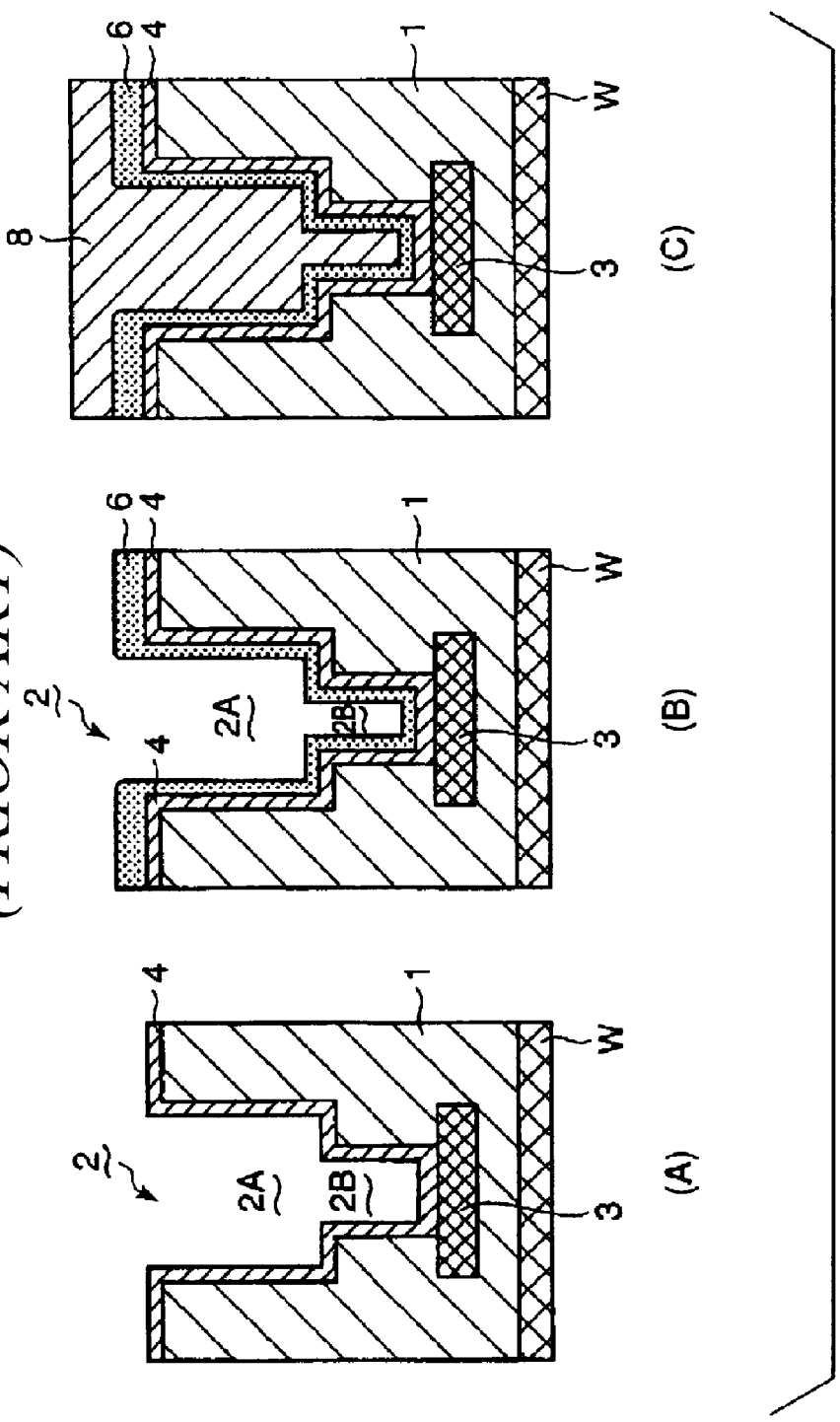
FIG. 12 shows a conventional filling process for filling a recess of a semiconductor wafer.

A schematic operation of the processing system 10 configured as described above will be explained. From the cassette container 26 provided in the loading port 24, a non-processed semiconductor wafer W is loaded into the inlet side transfer chamber 18 by the inlet side transfer device 28. The loaded wafer W is transferred to the orienter 32 provided at the end of the inlet side transfer chamber 18, and the position of the wafer W is aligned in the orienter 32. The wafer W includes, for example, a silicon substrate, and a recess 2 (see FIG. 12) has been previously formed on a surface of the wafer W.

After the position of the wafer W is aligned, the wafer W is loaded into one of the first and the second load lock chambers 16A and 16B by the inlet side transfer device 28. After the inside of the corresponding load lock chamber is vacuum-exhausted, the wafer W within the load lock chamber is loaded into the common transfer chamber 14 by the transfer device 20 within the common transfer chamber 14 that has been previously vacuum-exhausted.

The non-processed wafer W loaded into the common transfer chamber 14 is transferred into the first processing apparatus 12A, and a pre-treatment is performed on the wafer W. The pre-treatment includes a typical degas process or a cleaning process for cleaning the inside of the recess 2 formed on the surface of the wafer W. The cleaning process may include a $H_2$ plasma process, an Ar plasma process, a dry cleaning process using organic acid, and a cleaning process using hot-wire atomic hydrogen or the like.

After the pre-treatment is performed, the wafer W is loaded into the second processing apparatus 12B, and a first-metal-containing film forming process for forming the first-metal-containing film containing a first metal such as Ru is performed on the surface of the wafer W. In the first-metal-containing film forming process, as described below, the first-metal-containing film is formed by a heat treatment such as a thermal CVD process using a first-metal-containing source gas containing the first metal. By way of example, a Ru (ruthenium) film is formed.

After the first-metal-containing film forming process is completed, the wafer W is loaded into the third processing apparatus 12C, and a second-metal-containing film forming process for forming the second-metal-containing film containing a second metal having a barrier property against a filling metal to be filled in the recess is performed on the surface of the wafer W. The second-metal-containing film includes, for example, a MnOx film or a Mn film. As described above, by forming the Ru film and the MnOx film, or the Ru film and the Mn film in a layer structure, a barrier layer against a Cu film can be formed.

After the second-metal-containing film forming process is completed, the wafer W is loaded into the fourth processing apparatus 12D, and a filling process for filling the recess 2 by forming a film made of a third metal such as copper serving as the filling metal is performed on the surface of the wafer W. In some embodiments of the film forming method, the first-metal-containing film forming process and the second-metal-containing film forming process is performed repeatedly. Upon completion of the filling process, the processes performed in the processing system 10 are completed. The processed wafer W is accommodated in a cassette container 26 for processed wafers via one of the load lock chambers 16A and 16B and the inlet side transfer chamber 18. The inside of the common transfer chamber 14 is in a depressurized state under an atmospheric state of a rare gas such as an Ar gas or a He gas, or an inert gas such as a dry $N_2$ gas.

In accordance with the processing system of the first embodiment, both the second processing apparatus 12B and the third processing apparatus 12C is provided, and the first-metal-containing film forming process and the second-metal-containing film forming process is respectively performed in the processing apparatus 12B and 12C. Alternatively, the first-metal-containing film forming process may be performed and, subsequently, the second-metal-containing film forming process is performed in a same processing apparatus. A processing system in accordance with a second embodiment of the present disclosure is depicted in FIG. 2. In FIG. 2, the same components as depicted in FIG. 1 are assigned the same reference numerals, and redundant explanations thereof will be omitted.

As depicted in FIG. 2, a fifth processing apparatus 12E is provided instead of the second processing apparatus 12B shown in FIG. 1, and the third processing apparatus 12C (see FIG. 1) is not provided. As described below, in the fifth processing apparatus 12E, a first-metal-containing film such as a Ru film and a second-metal-containing film such as a MnOx film may be formed successively. In this case, since the number of the processing apparatuses is reduced by one, equipment costs can be reduced. In order to increase throughput, one more fourth processing apparatus 12D may be additionally provided at a position where the third processing apparatus 12C was positioned.

<Explanation of Second Processing Apparatus 12B>

Figure 3:
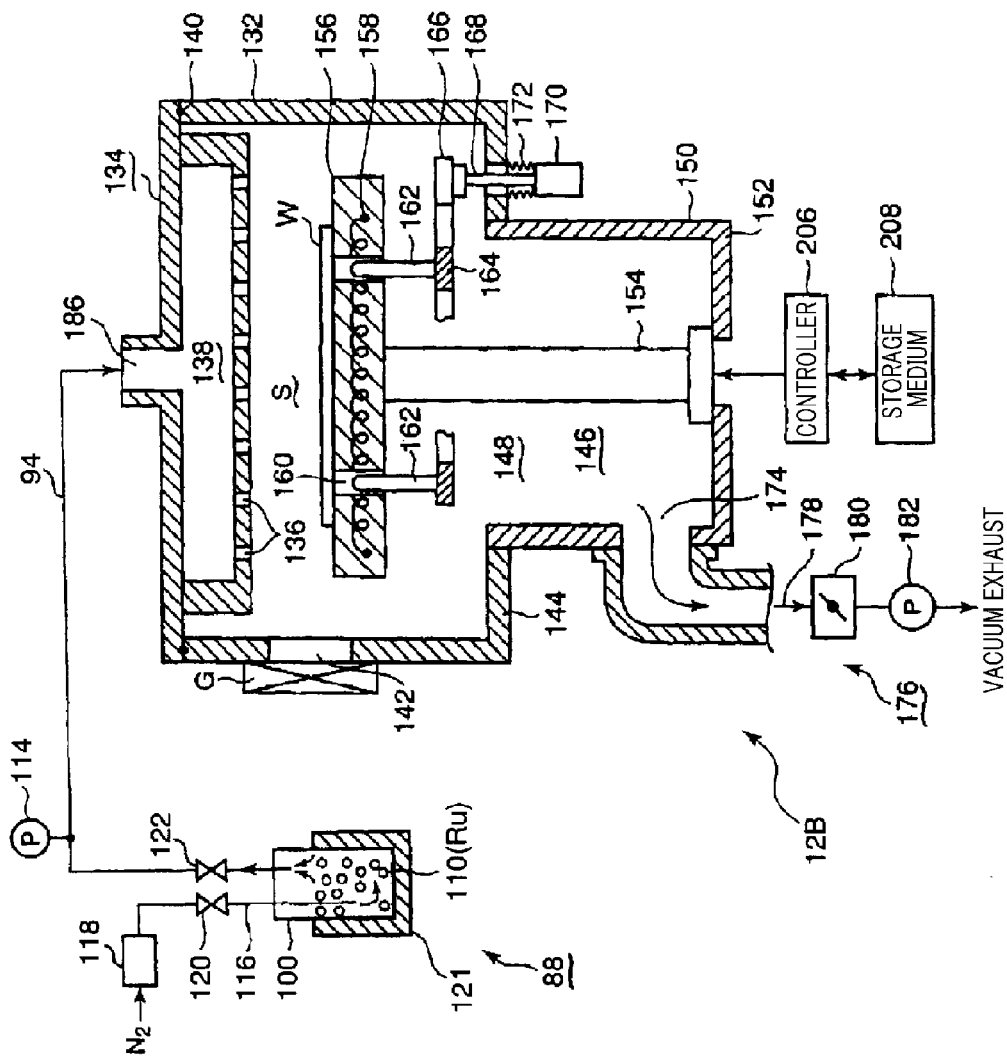
FIG. 3 is a configuration view showing an example of a second processing apparatus.

As described above, since the first processing apparatus 12A is a typical cleaning apparatus, corresponding explanations thereof will be omitted. Hereinafter, the second processing apparatus 12B will be explained. FIG. 3 is a configuration view showing an example of the second processing apparatus. As described above, the second processing apparatus 12B is configured to form the first-metal-containing film on the surface of the wafer by a thermal treatment by using the first-metal-containing source gas containing the first metal. Herein, there will be explained a case where the metal film such as the Ru film as the first-metal-containing film may be formed by a thermal CVD method.

The second processing apparatus 12B includes an aluminum processing chamber 132 having, for example, a substantially circular shape as a cross sectional shape. At a ceiling within the processing chamber 132, a shower head 134 serving as a gas introduction unit for introducing a processing gas such as a film forming gas is provided. The processing gas is discharged toward a processing space S through a multiple number of gas discharge holes 136 formed on a gas discharge surface of a lower surface of the shower head 134.

Within the shower head 134, a hollow gas diffusion space 138 is provided. The processing gas introduced into the gas diffusion space 138 may be horizontally diffused, and then, discharged through the gas discharge holes 136 communicating with the gas diffusion space 138. The whole shower head 134 may be made of, for example, nickel, a nickel alloy such as Hastelloy (registered trademark), aluminum or an aluminum alloy. At a joint portion between the shower head 134 and an upper end of the processing chamber 132, a sealing member 140 such as an O-ring is provided to maintain airtightness within the processing chamber 132.

At a sidewall of the processing chamber 132, a loading/unloading port 142 for loading/unloading the semiconductor wafer W as the target objet into/from the processing chamber 132 is formed. At the loading/unloading port 142, a gate valve G which can be opened and airtightly closed is provided.

At a bottom portion 144 of the processing chamber 132, an exhaust space 146 is formed. To be specific, at a center of the bottom portion 144, a large opening 148 may be formed. The central portion of the bottom portion 144 where the opening 148 is formed is connected to a cylindrical wall 150 having a bottom. The cylindrical wall 150 is extended downwards from the opening 148, and the exhaust space 146 is formed therein. At a bottom portion 152 of the cylindrical wall 150 that defines the exhaust space 146, a cylindrical supporting column 154 is provided uprightly. At an upper end of the supporting column 154, a mounting table 156 for mounting thereon the semiconductor wafer W is provided.

The mounting table 156 may be made of, for example, ceramic or quartz glass. Within the mounting table 156, a resistance heater 158 serving as a heating unit is accommodated. Here, the resistance heater 158 may include a carbon wire heater that generates heat by a power from a power supply. The resistance heater 158 heats the semiconductor wafer W mounted on an upper surface of the mounting table 156.

In the mounting table 156, a multiple number of, for example, three, pin insertion holes 160 are vertically formed (only two illustrated in FIG. 3). An upthrust pin 162 is inserted into each of the pin insertion hole 160 so as to be movable vertically. At a lower end of the upthrust pin 162, an upthrust ring 164 made of ceramic such as alumina is provided. The upthrust ring 164 supports the lower end of the upthrust pin 162. An arm 166 extended from the upthrust ring 164 is connected to an up/down rod 168 penetrating the bottom portion 144 of the processing chamber. The up/down rod 168 may be vertically elevated by an actuator 170.

With this configuration, when the wafer W is transferred, each of the upthrust pins 162 may be protruded from and retracted into an upper end of each of the pin insertion hole 160. At a penetrated portion in the bottom portion 144 where the up/down rod 168 of the actuator 170 penetrates, an extensible and contractible bellows 172 is provided. Thus, the up/down rod 168 can be vertically moved up and down while maintaining airtightness within the processing chamber 132.

The opening 148 on an inlet side of the exhaust space 146 may have a diameter smaller than that of the mounting table 156. A gas flowing downward beyond a periphery of the mounting table 156 may travel a lower side of the mounting table 156 and then may be introduced into the opening 148. At a lower sidewall of the cylindrical wall 150, an exhaust opening 174 is formed so as to communicate with the exhaust space 146. The exhaust opening 174 is connected to a vacuum exhaust unit 176.

The vacuum exhaust unit 176 may include an exhaust path 178 connected to the exhaust opening 174. The exhaust path 178 may be provided with a pressure control valve 180, a vacuum pump 182 or a waste gas scrubber (not illustrated) in sequence. The vacuum exhaust unit 176 is configured to vacuum-exhaust the inside of the processing chamber 132 and the exhaust space 146 while controlling pressures therein.

In order to supply a certain gas to the shower head 134, the shower head 134 is connected to a source gas supply unit 88 configured to supply a first-metal-containing source gas. To be specific, the source gas supply unit 88 configured to supply a first-metal-containing source gas includes a source gas flow path 94 connected to a gas inlet 186 of the gas diffusion space 138.

The other end of the source gas flow path 94 is connected to a first source tank 100 for storing therein a solid source 110. Further, an opening/closing valve 122 and a pressure gauge 114 are provided at the source gas flow path 94, and the pressure gauge 114 measures an internal pressure of the source gas flow path 94. The pressure gauge 114 may include, for example, a capacitance manometer. Since the source 110 has a very low vapor pressure, it is difficult to vaporize the source 110. Accordingly, in order to accelerate vaporization of the source 110, by setting the source gas flow path 94 to have a relatively large diameter and a length as short as possible, an internal pressure of the first source tank 100 is set to be close to an internal pressure of the processing chamber 132.

Within the first source tank 100, a bubbling gas line 116 having a leading end positioned near a bottom of the first source tank 100 is provided. A flow rate controller 118 such as a mass flow controller and an opening/closing valve 120 are provided at the bubbling gas line 116 in sequence. With this configuration, a bubbling gas is introduced into the first source tank 100 while a flow rate of the bubbling gas is controlled, and the source 110 may be vaporized into a source gas. The source gas is supplied together with the bubbling gas.

As the bubbling gas, a $N_2$ gas as an inert gas is used in the present embodiment. Instead, CO (carbon monoxide) or a rare gas such as a He gas or an Ar gas may be used. The first source tank 100 includes a tank heating unit 121 for heating the source 110 in order to accelerate vaporization of the source 110. Here, as the source 110, granular solid ruthenium carbonyl ($Ru_3(CO)_{12}$) containing ruthenium (Ru) as an example of the first metal may be used.

In order to prevent the source gas from being re-condensed, the source gas flow path 94 and the opening/closing valve 122 may be wound with a tape heater, an aluminum block heater, a mantle heater or a silicon rubber heater (which are not shown) for heating the source gas flow path 94 and the opening/closing valve 122.

Although not illustrated, a purge inert gas supply unit is connected to the shower head 134, and if necessary, it may supply a purge gas. The purge gas may include an inert gas such as a $N_2$ gas, an Ar gas, a He gas, or a Ne gas.

The second processing apparatus 12B includes a controller 206 including, for example, a computer that controls the whole operation of the processing apparatus. The controller 206 controls the start or stop of a gas supply, a gas supply rate, an internal pressure of the processing chamber 132, and a temperature of the wafer W. The controller 206 includes a storage medium 208 for storing a computer program for performing the above-described control operations.

Here, a relationship between a flow rate of the bubbling gas, a flow rate of the source gas and a pressure value measured by the pressure gauge 114 is previously stored in the storage medium as reference data. When a film is formed, by controlling a flow rate of the bubbling gas based on the pressure value measured by the pressure gauge 114, a supply rate of the source gas can be controlled. The storage medium 208 may include, for example, a flexible disk, a flash memory, a hard disk, and a CD (Compact Dick). The controller 206 is operated under the control of the system controller 34 (see FIG. 1).

Hereinafter, an operation of the second processing apparatus 12B configured as described above will be explained. The semiconductor wafer W is held by a non-illustrated transfer arm, and then, is loaded into the processing chamber 132 via the opened gate valve G and the loading/unloading port 142. The wafer W is transferred to the upwardly elevated upthrust pin 162. Then, by moving the upthrust pin 162 down, the wafer W is mounted and supported on the upper surface of the mounting table 156.

Thereafter, the source gas supply unit 88 is operated to supply the source gas to the shower head 134 while controlling a flow rate of the source gas. The source gas is discharged through the gas discharge holes 136 and introduced into the processing space S. The source gas may be supplied in various ways as described below.

By continuously operating the vacuum pump 182 provided in the vacuum exhaust unit 176, the inside of the processing chamber 132 or the exhaust space 146 can be vacuum-exhausted. By controlling an opening degree of the pressure control valve 180, an atmosphere in the processing space S can be maintained at a certain process pressure. At this time, the wafer W is heated by the resistance heater 158 provided within the mounting table 156 and maintained at a certain process temperature. In this way, a first-metal-containing film, i.e., a Ru film may be formed on the surface of the semiconductor wafer W.

<Explanation of Third Processing Apparatus 12C>

Figure 4:
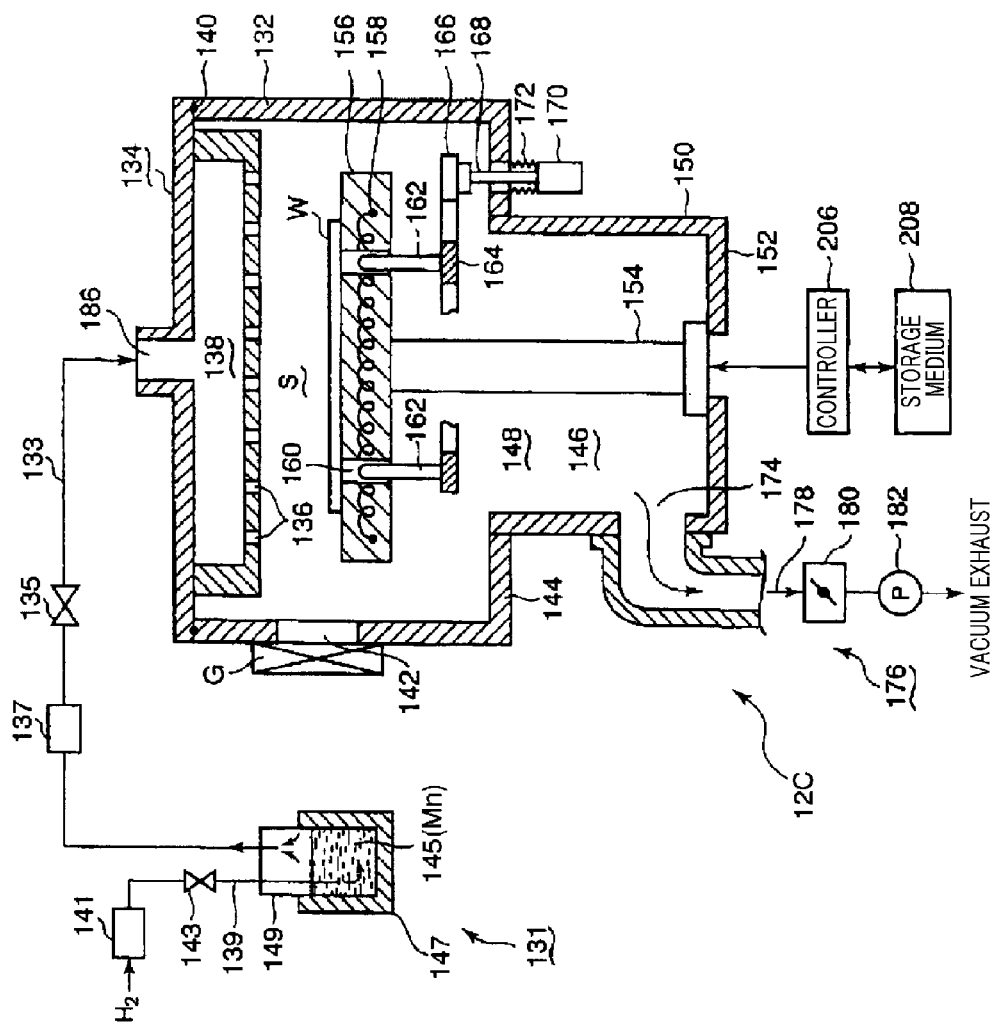
FIG. 4 is a configuration view showing an example of a third processing apparatus.

Hereinafter, the third processing apparatus 12C will be explained. As described above, since the fourth processing apparatus 12D is a typical thermal film forming processing apparatus, redundant explanations thereof will be omitted. FIG. 4 is a configuration view showing an example of the third processing apparatus. The third processing apparatus 12C is configured to form, on the surface of the wafer, the second-metal-containing film containing the second metal having a barrier property against the filling metal to be filled. In the embodiment, the second metal is Mn, and the second-metal-containing film is a MnOx film (or the second-metal-containing film may partially include a Mn film).

The third processing apparatus 12C has substantially the same configuration as that of the second processing apparatus 12B except a source gas supply unit. Therefore, the source gas supply unit will be mainly explained, and the same components as depicted in FIG. 3 are assigned the same reference numerals and explanations thereof will be omitted.

That is, in order to supply a certain gas to the shower head 134, the shower head 134 is connected to a source gas supply unit 131 configured to supply a source gas of a second-metal-containing film. To be specific, the source gas supply unit 131 includes a source gas flow path 133 connected to the gas inlet 186 of the gas diffusion space 138.

An opening/closing valve 135 and a flow rate controller 137 such as a mass flow controller are provided at the source gas flow path 133 in sequence, and the source gas flow path 133 is connected to a second source tank 149 for storing therein a second-metal-containing source 145.

Within the second source tank 149, a bubbling gas line 139 having a leading end positioned near a bottom of the second source tank 149 is provided. A flow rate controller 141 such as a mass flow controller and an opening/closing valve 143 are provided at the bubbling gas line 139 in sequence. With this configuration, a bubbling gas is introduced into the second source tank 149 while a flow rate of the bubbling gas is controlled, and the source 145 may be vaporized into a source gas. The source gas is supplied together with the bubbling gas.

As the bubbling gas, a $H_2$ gas as a reduction gas is used. The second source tank 149 includes a tank heating unit 147 for heating the source 145 in order to accelerate vaporization of the source 145. Here, as the source 145, $(EtCp)_2Mn$ (precursor) as a liquid source containing Mn serving as the second metal is used.

As the reduction inert gas serving as the bubbling gas, an inert gas including a $N_2$ gas or a rare gas such as a He gas, a Ne gas or an Ar gas may be used instead of the $H_2$ gas. In order to prevent the source gas from being re-condensed, the source gas flow path 133, the opening/closing valve 135, and the flow rate controller 137 may be wound with a tape heater, an aluminum block heater, a mantle heater or a silicon rubber heater (which are not shown) for heating the source gas flow path 133, the opening/closing valve 135, and the flow rate controller 137.

Although not illustrated, a purge inert gas supply unit is connected to the shower head 134, and if necessary, it may supply a purge gas. The purge gas may include an inert gas such as a $N_2$ gas, an Ar gas, a He gas or a Ne gas, or a reduction gas such as a $H_2$ gas.

The third processing apparatus 12C includes the controller 206 including, for example, a computer that controls the whole operation of the processing apparatus. The controller 206 controls the start or stop of a gas supply, a gas supply rate, an internal pressure of the processing chamber 132, and a temperature of the wafer W. The controller 206 includes the storage medium 208 for storing a computer program for performing the above-described control operations. The storage medium 208 may include, for example, a flexible disk, a flash memory, a hard disk, and a CD (Compact Dick). The controller 206 is operated under the control of the system controller 34 (see FIG. 1).

Hereinafter, an operation of the third processing apparatus 12C configured as described above will be explained. The semiconductor wafer W is held by the transfer device 20 (see FIG. 1), and then, is loaded into the processing chamber 132 via the opened gate valve G and the loading/unloading port 142. The wafer W is transferred to the upwardly elevated upthrust pin 162. Then, by moving the upthrust pin 162 down, the wafer W is mounted and supported on the upper surface of the mounting table 156.

Thereafter, the source gas supply unit 131 for supplying the second-metal-containing source is operated to supply a film forming gas to the shower head 134 while controlling a flow rate of the film forming gas. The film forming gas is discharged through the gas discharge holes 136 and introduced into the processing space S.

By continuously operating the vacuum pump 182 provided in the vacuum exhaust unit 176, the inside of the processing chamber 132 or the exhaust space 146 can be vacuum-exhausted. By controlling an opening degree of the pressure control valve 180, an atmosphere in the processing space S can be maintained at a certain process pressure. At this time, the wafer W is heated by the resistance heater 158 provided within the mounting table 156 and maintained at a certain process temperature. In this way, the second-metal-containing film, i.e., a MnOx film (or the second-metal-containing film may partially include a Mn film) may be formed on the surface of the semiconductor wafer W.

<Explanation of Fifth Processing Apparatus 12E>

Figure 5:
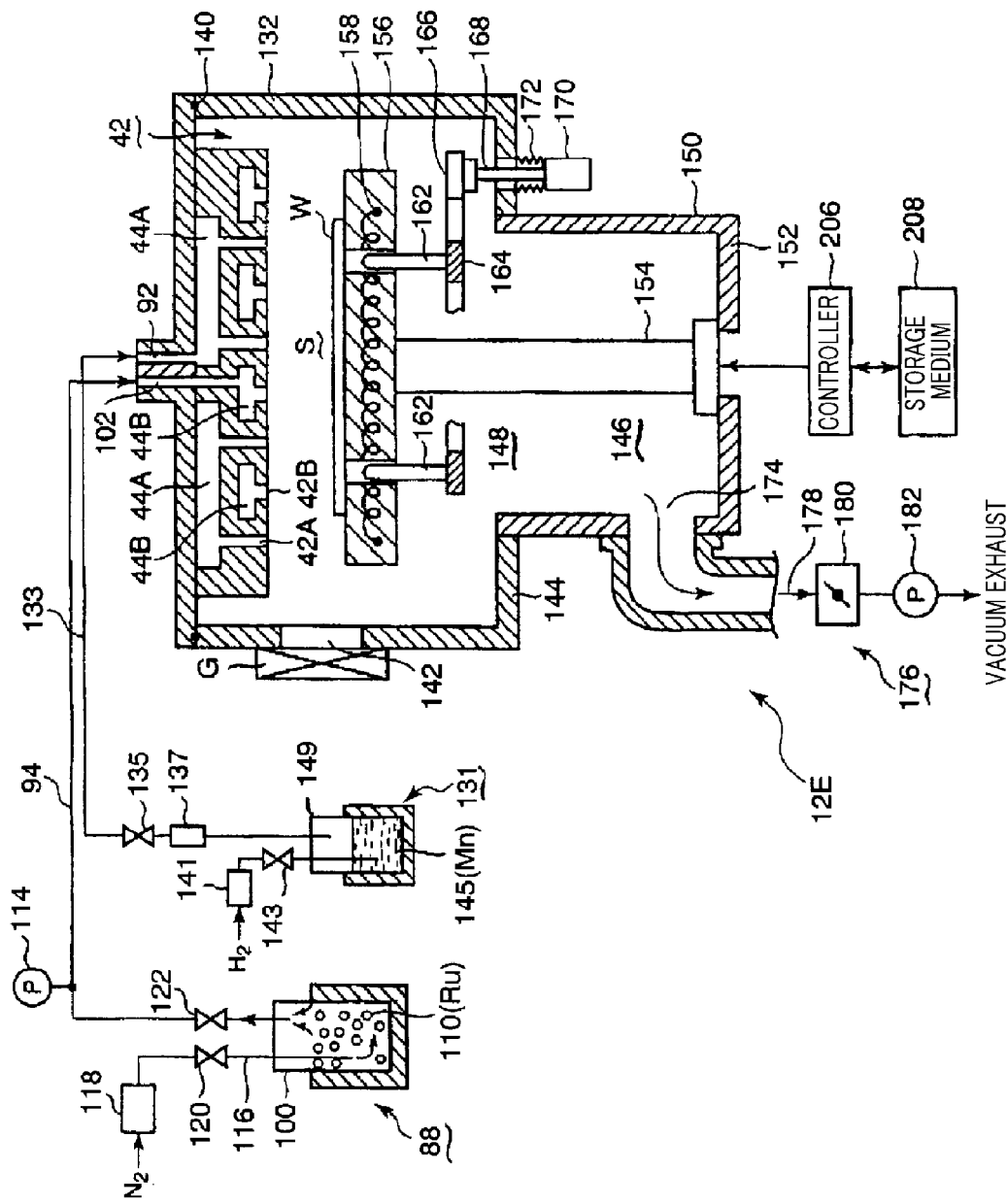
FIG. 5 is a configuration view showing an example of a fifth processing apparatus.

Hereinafter, the fifth processing apparatus 12E (see FIG. 2) will be explained. FIG. 5 is a configuration view showing an example of the fifth processing apparatus. The same components as depicted in FIGS. 3 and 4 are assigned the same reference numerals, and redundant explanations thereof will be omitted.

The fifth processing apparatus 12E is configured to form a Ru film as the first-metal-containing film and a MnOx film (including a Mn film) as the second-metal-containing film by a single processing apparatus. The fifth processing apparatus 12E includes the aluminum processing chamber 132 having, for example, a substantially circular shape as a cross sectional shape. At the ceiling within the processing chamber 132, a shower head 42 serving as a gas introduction unit for introducing a processing gas such as a film forming gas is provided. The processing gas is discharged toward a processing space S through a multiple number of gas discharge holes 42A and 42B formed in a gas discharge surface of a lower surface of the shower head 42.

Within the shower head 42, two divided hollow gas diffusion spaces 44A and 44B are provided. The processing gases introduced into the gas diffusion spaces 44A and 44B are horizontally diffused and then discharged through the gas discharge holes 42A and 42B communicating with the gas diffusion spaces 44A and 44B, respectively. That is, the gas discharge holes 42A and 42B are arranged in a matrix pattern, and the processing gases respectively discharged from the gas discharge holes 42A and 42B are mixed with each other in the processing space S.

Such gas supply method is referred to as "post-mix method." The whole shower head 42 is made of, for example, nickel, a nickel alloy such as Hastelloy (registered trademark), aluminum or an aluminum alloy. At a joint portion between the shower head 42 and an upper end of the processing chamber 132, the sealing member 140 such as an O-ring is provided to maintain airtightness within the processing chamber 132.

In order to supply a certain gas to the shower head 42, the shower head 42 is connected to the source gas supply unit 88 configured to supply the first-metal-containing source gas and the source gas supply unit 131 configured to supply the second-metal-containing source gas. To be specific, the source gas supply unit 88 for supplying the first-metal-containing source gas includes the source gas flow path 94 connected to a gas inlet 102 of the gas diffusion space 44B. The source gas supply unit 131 for supplying the second-metal-containing source gas includes the source gas flow path 133 connected to a gas inlet 92 of the other gas diffusion space 44A.

Although not illustrated, a purge inert gas supply unit is connected to the shower head 42, and if necessary, it may supply a purge gas. The purge gas may include an inert gas such as a $N_2$ gas, an Ar gas, a He gas, or a Ne gas.

Here, the gas inlets 102 and 92 are respectively connected to the gas flow path 94 of the source gas supply unit 88 for the first-metal-containing source gas and the gas flow path 133 of the source gas supply unit 131 for the second-metal-containing source gas (post-mix method). Alternatively, as depicted in FIGS. 3 and 4, two gas flow paths may be connected to a shower head including only one gas diffusion space (pre-mix method). In the fifth processing apparatus 12E, the MnOx film (including the Mn film) and the Ru film can be respectively formed by a single processing apparatus.

<Film Forming Method of Present Disclosure>

Figure 6:
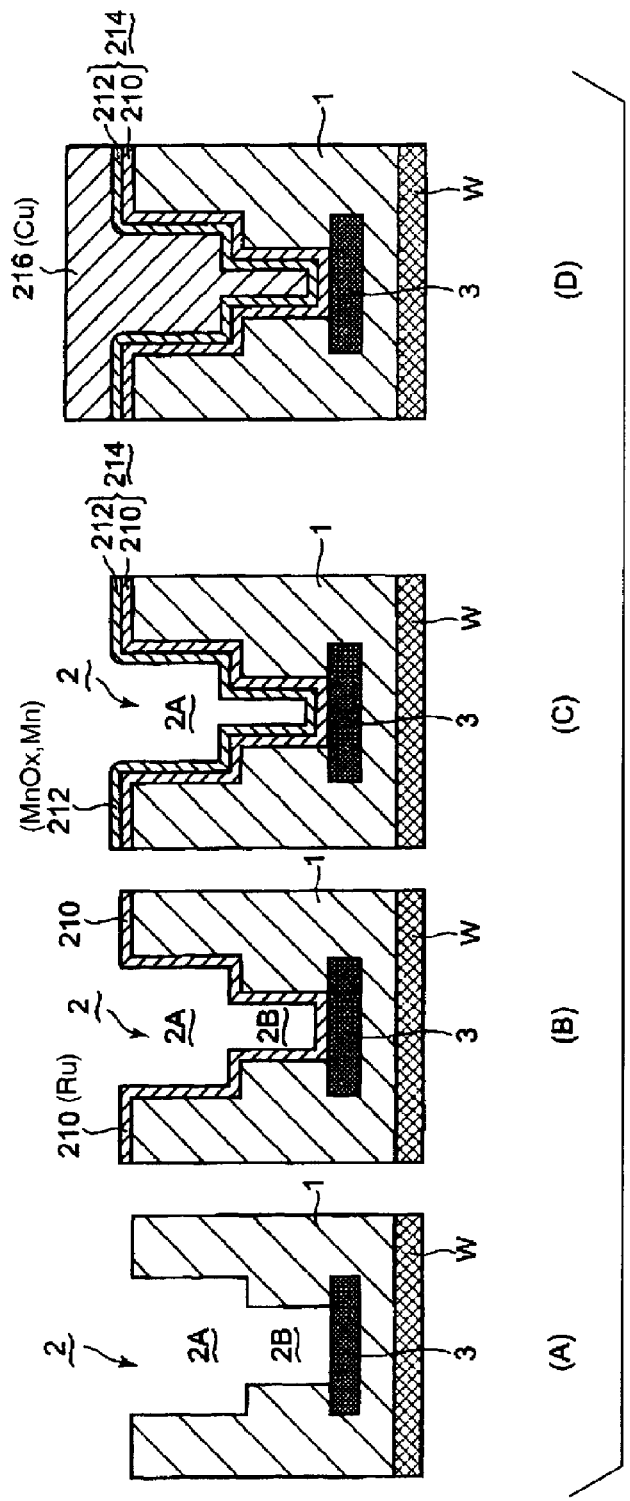
FIG. 6 provides an example of a forming status of a thin film in each process of a film forming method in accordance with a first embodiment of the present disclosure.
Figure 7:
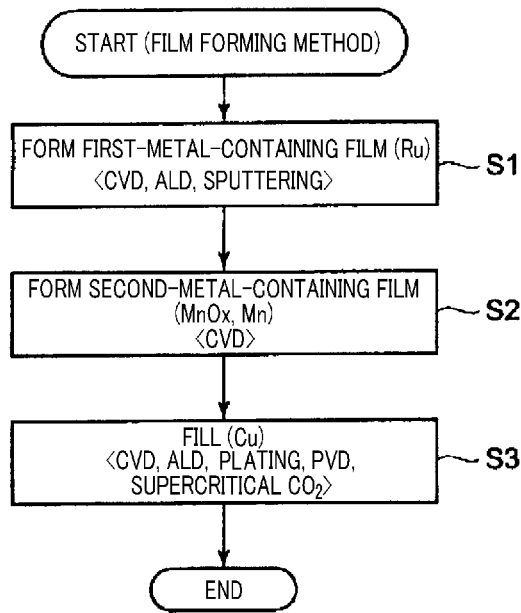
FIG. 7 is a flow chart showing each basic process of the film forming method in accordance with the first embodiment of the present disclosure.
Figure 8:
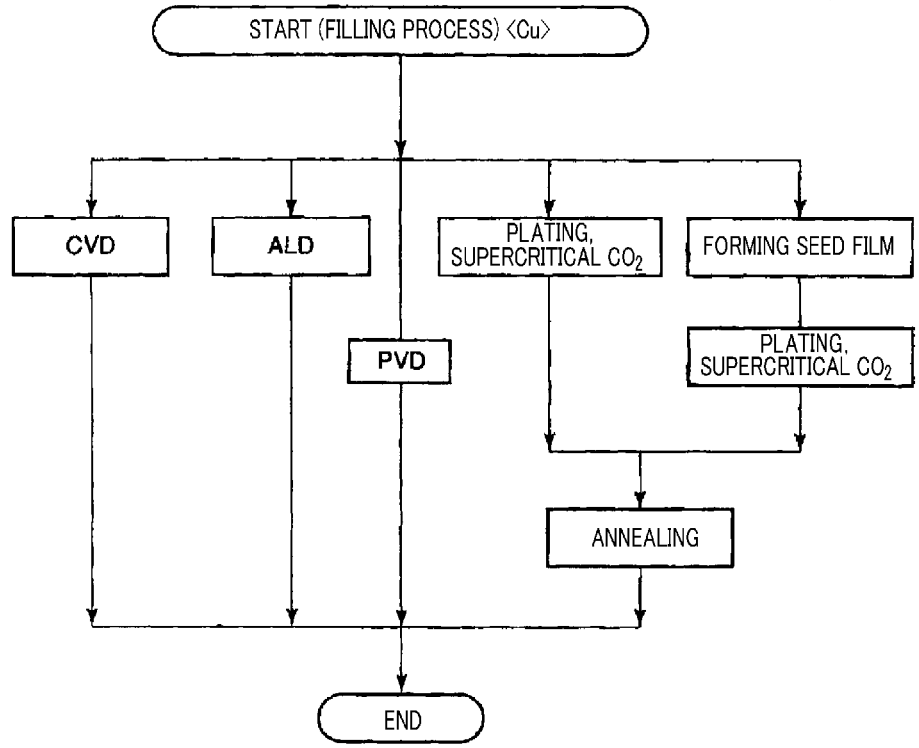
FIG. 8 shows various aspects for performing a filling process.
Figure 9:
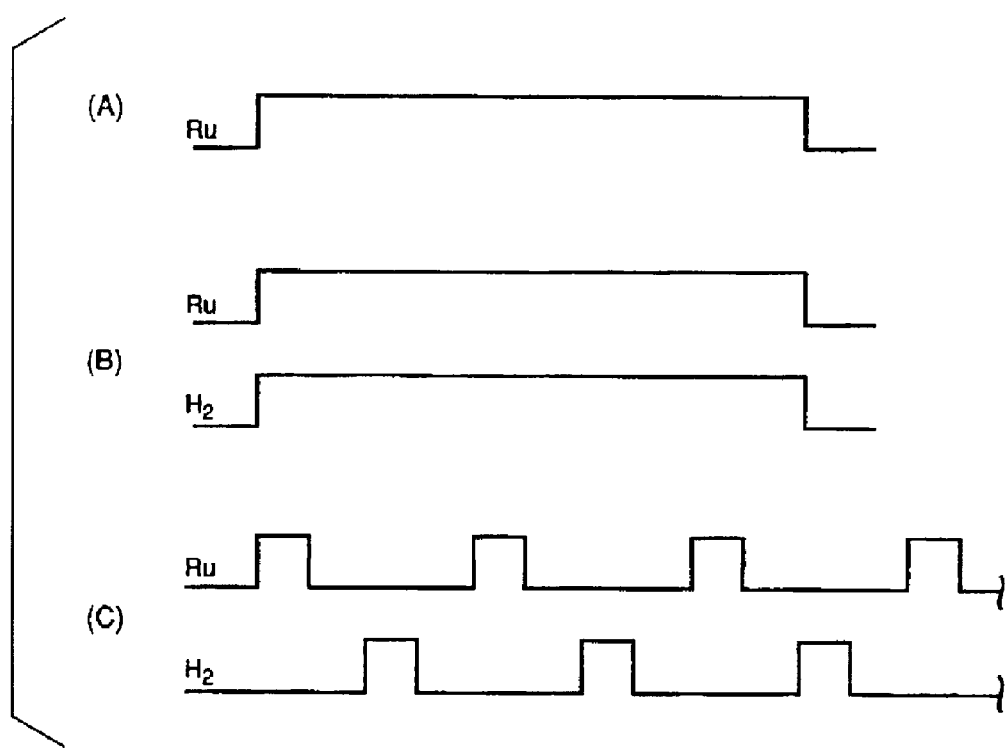
FIG. 9 is a timing chart showing a supply status of each gas when a first-metal-containing film forming process is performed.
Figure 10:
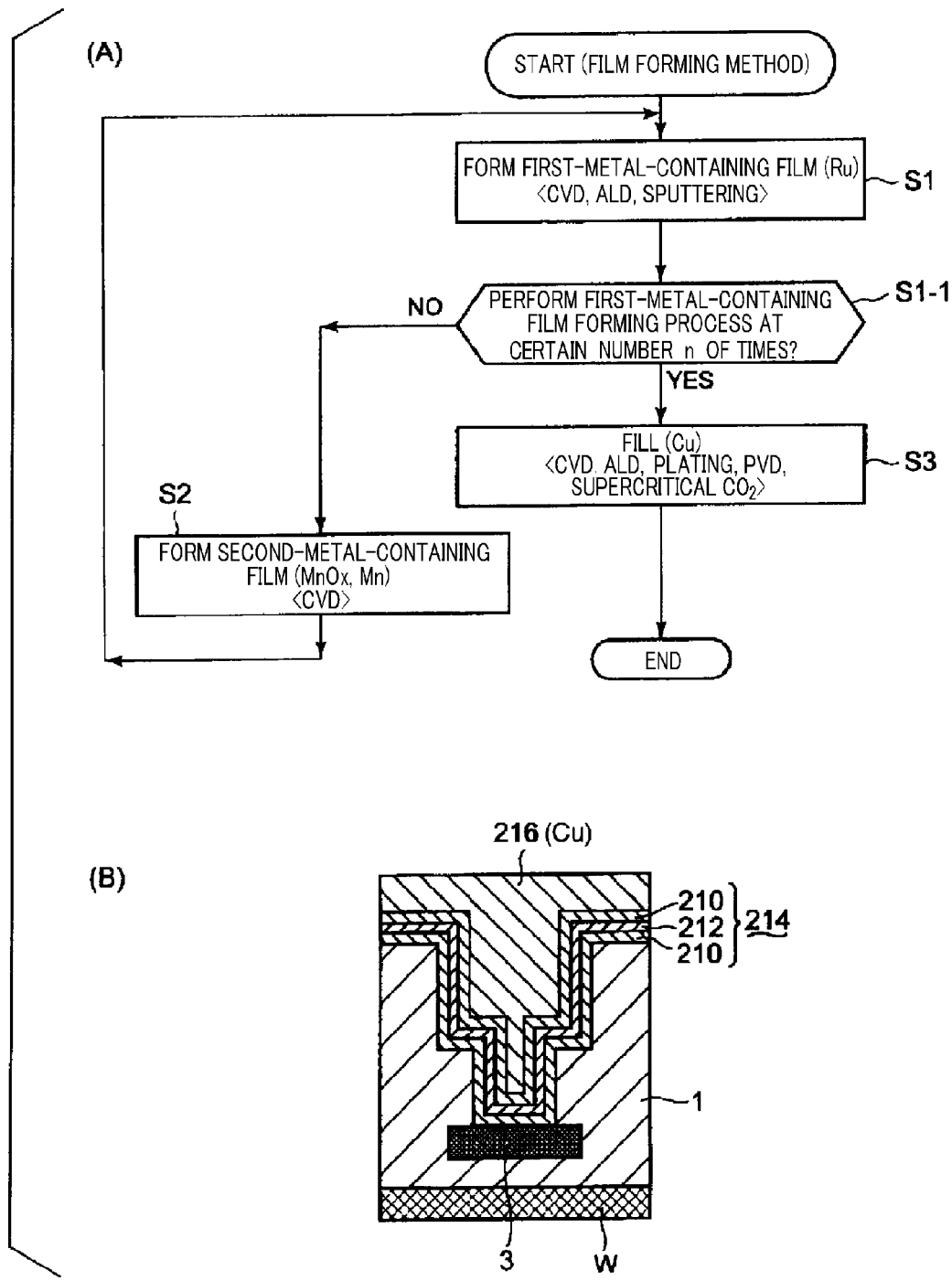
FIG. 10 is an explanatory diagram for explaining a film forming method in accordance with a second embodiment of the present disclosure.

There will be explained a film forming method in accordance with an embodiment of the present disclosure to be performed by the processing system or the processing apparatus as depicted in FIGS. 1 to 5. FIG. 6 provides an example of a forming status of a thin film in each process of a film forming method in accordance with a first embodiment of the present disclosure. FIG. 7 is a flow chart showing each basic process of the film forming method in accordance with the first embodiment of the present disclosure. FIG. 8 shows various aspects for performing a filling process, and FIG. 9 is a timing chart showing a supply status of each gas when a first-metal-containing film forming process is performed. FIG. 10 is an explanatory diagram for explaining a film forming method in accordance with a second embodiment of the present disclosure.

One of features of the present disclosure is that a second-metal-containing film containing manganese (Mn) as a second metal can be efficiently formed by previously forming a first-metal-containing film containing Ru as a first metal serving as a underlying film, before the second-metal-containing film is formed on a surface of an insulating layer made of a low-k film having a low specific permittivity. Here, the first-metal-containing film is a Ru film formed by the second processing apparatus 12B or the fifth processing apparatus 12E, and the second-metal-containing film is a MnOx film or a Mn film formed by the third processing apparatus 12C or the fifth processing apparatus 12E. Further, as a material of the low-k film, a material having a specific permittivity lower than a specific permittivity of about 4.1, which is a specific permittivity of a $SiO_2$ film, may be used.

When the wafer W is loaded into the processing system 10 depicted in FIG. 1 or FIG. 2, as depicted in FIG. 6(A), a recess 2 such as a trench or a hole has been previously formed on a surface of an insulating layer 1 serving as an interlayer insulating film formed on the wafer W. An underlying wiring layer 3 as a metallic layer made of copper is exposed to (is exposed at) a bottom of the recess 2.

To be specific, the recess 2 includes a groove (trench) 2A having a narrow and long recess shape as a cross sectional shape and a hole 2B formed at a part of a bottom of the groove 2A. This hole 2B becomes a contact hole or a through hole. The wiring layer 3 as the metallic layer is exposed to a bottom of the hole 2B, and electrically connected to the underlying wiring layer or an element such as a transistor. Illustration of the underlying wiring layer or the element such as the transistor is omitted. The insulating layer 1 serving as the underlying layer is made of a low-k film, such as a SiOC film, having a specific permittivity lower than about 4.1.

In accordance with the present disclosure, by performing a pre-treatment such as a degas process or a cleaning process on the surface of the semiconductor wafer W, an inner surface of the recess 2 can be cleaned. The cleaning process is performed by the first processing apparatus 12A (see FIG. 1). As described above, the cleaning process includes a $H_2$ plasma process, an Ar plasma process, a dry cleaning process using organic acid, and a cleaning process using hot-wire atomic hydrogen.

In accordance with the present disclosure, the film forming method may include the first embodiment and the second embodiment. FIG. 7 is a flow chart of the film forming method of the first embodiment. In the film forming method of the first embodiment, as depicted in FIG. 7, a first-metal-containing film forming process for forming a first-metal-containing film containing a first metal such as Ru is performed on the target object that has been subjected to the pre-treatment (S1). Subsequently, a second-metal-containing film forming process for forming a second-metal-containing film containing Mn as a second metal having a barrier property against a filling metal, such as Cu, to be filled in the recess 2 is performed (S2). In this way, a barrier layer including a single layer of the first-metal-containing film and a single layer of the second-metal-containing film can be formed.

Then, the filling metal such as Cu is filled in the recess 2 on the wafer W (S3). The film forming method of the first embodiment will be explained in detail below. On a surface of the wafer W that has been subjected to the pre-treatment, as depicted in FIG. 6(B), the first-metal-containing film forming process for forming a first-metal-containing film 210 is performed (S1 in FIG. 7). This process is performed by the second processing apparatus 12B or the fifth processing apparatus 12E (see FIG. 2). In this way, the first-metal-containing film 210 can be formed on the entire surface of the wafer including the inner surface of the recess 2. The first-metal-containing film 210 is made of a Ru film in this embodiment.

The first-metal-containing film 210 is formed by means of, desirably, a CVD (Chemical Vapor Deposition) method but may be formed by means of an ALD (Atomic Layered Deposition) method. The ALD (Atomic Layered Deposition) method refers to a film forming method for alternately layering thin films by repeatedly forming a single layer of an atomic level thin film or a single layer of a molecular level thin film one by one by alternately supplying different film forming gases. Since the Ru film as the first-metal-containing film 210 has high wettability, the Mn-containing film forming process can be performed efficiently in a post-process. As a result, the Mn-containing film can be formed efficiently. The first-metal-containing film 210 is formed by means of any one of a CVD method, an ALD method, and a sputtering method. If the first-metal-containing film 210 is formed by the sputtering method, a sputter film forming apparatus configured to perform sputtering on a metal Ru target may be used as the second processing apparatus 12B.

Upon completion of the first-metal-containing film forming process, as depicted in FIG. 6(C), the second-metal-containing film forming process (S2 in FIG. 7) is performed to form a second-metal-containing film 212 having a barrier property against a filling metal on the surface of the wafer W. This process is performed by the third processing apparatus 12C or the fifth processing apparatus 12E. In this way, the second-metal-containing film 212 can be formed on the entire surface of the wafer including the inner surface of the recess 2.

The second-metal-containing film 212 is made of a MnOx film (or the second-metal-containing film may partially include a Mn film). To be specific, the Mn film formed on an inner sidewall of the recess 2 and on an upper surface of the wafer is changed to the MnOx film by a reaction between the Mn film and oxygen components of the insulating layer 1 that penetrate through the first-metal-containing film (the Ru film) as an underlying film. The Ru film formed on the wiring layer (Cu) 3 exposed to the bottom of the recess 2 remains as a metallic layer. The first-metal-containing film (the Ru film) and the second-metal-containing film (the MnOx film or the Mn film) constitute a barrier layer 124. The second-metal-containing film may be formed by a CVD method, an ALD method, or the like.

Upon completion of the second-metal-containing film forming process, as depicted in FIG. 6(D), the filling process (S3 in FIG. 7) is performed to fill a filling metal 216 in the recess 2. This process is performed by the fourth processing apparatus 12D. In this way, the recess 2 can be completely filled, and the filling metal 216 can be formed on the entire surface of the wafer. Cu (Cu film) may be used as the filing metal 216.

The filling metal 216 may be formed by means of any one of a CVD method, an ALD method, a PVD (sputtering) method, a supercritical $CO_2$ method, and a plating method. If the filling process is performed by the plating method or the supercritical $CO_2$ method, a Cu seed film may be formed by the fourth processing apparatus 12D, and the filling process may be performed by a processing apparatus provided outside the processing system 10.

The film forming process is completed as described above. Then, remnants of the filling metal 216 on the surface of the wafer are removed by means of a CMP method.

As described above, by forming the first-metal-containing film containing the first metal such as Ru as the underlying film before the second-metal-containing film 212 containing the second metal such as Mn, having the barrier property against the filling metal, the second-metal-containing film can be formed efficiently. Therefore, the barrier layer 214 can have a high barrier property.

Hereinafter, each of the above-described processes will be explained in detail. The first-metal-containing film forming process (S1) for forming the first-metal-containing film 210 (Ru film) is performed by means of any one of the CVD method, the ALD method and the sputtering method as explained in process S1 of FIG. 7. Firstly, the CVD method as a first method is performed as depicted in FIG. 9(A) or FIG. 9(B). That is, the film forming method depicted in FIG. 9(A) is performed by the second processing apparatus 12B depicted in FIG. 3 or the fifth processing apparatus 12E depicted in FIG. 5.

In the film forming method depicted in FIG. 9(A), a Ru-containing source gas generated by vaporizing the source 110 such as ruthenium carbonyl is transferred with a bubbling gas, and thermally decomposed by means of the CVD method so as to form the first-metal-containing film 210 made of the Ru film. Here, as process conditions, a process pressure may be set to be, desirably, in a range of from about 0.1 mTorr to about 200 mTorr, more desirably, in a range of from about 2 mTorr to about 50 mTorr. Further, a process temperature may be set to be, desirably, in a range of from about 50° C. to about 500° C., more desirably, in a range of from about 150° C. to about 350° C.

A gas flow rate is controlled by controlling a flow rate of the bubbling gas based on a pressure value measured by the pressure gauge 114 as described above. By way of example, the flow rate of the bubbling gas may be set to be in a range of from about 0.1 sccm to about 1000 sccm.

In the CVD method depicted in FIG. 9(B), a $H_2$ gas is used as a reduction gas. The CVD method using the $H_2$ gas may be performed by a processing apparatus further including a $H_2$ gas supply unit added to the shower head 134 of the second processing apparatus 12B depicted in FIG. 3. Here, by simultaneously supplying the source gas containing Ru and the $H_2$ gas, decomposition or reduction of the source gas containing Ru may be accelerated by the $H_2$ gas. As a result, the first-metal-containing film 210 made of the Ru film can be formed. In this case, by supplying the reduction gas, a material characteristic of the Ru film can be improved. By way of example, electrical resistance of the Ru film can be reduced. At this time, process conditions such as a process pressure or a process temperature are the same as described above by reference to FIG. 9(A).

Secondly, in the ALD method as a second method depicted in FIG. 9(C), by intermittently and alternately supplying a source gas containing Ru and a $H_2$ gas as a reduction gas are supplied by the processing apparatus explained above with reference to FIG. 9(B), an atomic level or molecular level thin film is layered. In this way, the first-metal-containing film 210 made of the Ru film can be formed.

At this time, process conditions such as a process pressure or a process temperature are the same as described above by reference to FIG. 9(A). The reduction gas is not limited to the $H_2$ gas and may include a CO or silicon-containing gas, a boron-containing gas, and a nitrogen-containing gas. The silicon-containing gas may include, for example, $SiH_4$, $Si_2H_6$, and $SiCl_2H_2$. The boron-containing gas may include, for example, $BH_3$, $B_2H_5$, and $B_3H_9$. The nitrogen-containing gas may include, for example, $NH_3$.

Thirdly, in the sputtering method as a third method, as described above, a sputter film forming apparatus as the second processing apparatus 12B is used to perform sputtering on the metal Ru as a target object. Thus, the first-metal-containing film 210 made of the Ru film can be formed on the surface of the wafer W.

Desirably, the second-metal-containing film forming process (S2) for forming the second-metal-containing film 212 (the MnOx film and the Mn-containing film including the Mn film) by the third processing apparatus 12C is performed by means of the CVD method. To be specific, the source 145 containing Mn is bubbled by a hydrogen gas as a reduction gas and supplied to form the second-metal-containing film 212 containing Mn by means of the thermal CVD method. Here, the Mn film reacts with oxygen components of the insulating layer 1 that penetrate through the Ru film as an underlying film. As a result, the MnOx film can be formed.

However, an underlying layer of the Ru film at the bottom of the hole 2B of the recess 2 is the wiring layer 3 made of Cu. Thus, the Mn film positioned above the bottom of the hole 2B may remain as it is without being oxidized. Therefore, at the bottom of the hole 2B of the recess 2, the wiring layer 3, the Ru film, and the Mn film may be directly connected to each other, and electrical resistance may be reduced. At this time, as process conditions, a process temperature (which is the same as wafer temperature hereinafter) may be set to be in a range of from about 70° C. to about 450° C., and a process pressure may be set to be in a range of from about 1 Pa to about 13 kPa. A flow rate of the source gas containing Mn is not limited but may be in a range of from about 0.1 sccm to about 10 sccm in consideration of a film forming rate.

Thereafter, the filling process S3 for filling the recess 2 is performed by means of any one of the CVD method, the ALD method, the PVD (sputtering) method, the plating method and the supercritical $CO_2$ method as depicted in FIG. 8. If the filling process S3 is performed by means of the plating method or the supercritical $CO_2$ method, before the filling process, a seed film made of conductive metal such as Cu may be formed. Further, desirably, after the filling process, an annealing process may be performed.

In the CVD method as the first method, the Cu-containing source gas and the $H_2$ gas as a reduction gas are simultaneously supplied, and a Cu film is formed by means of the CVD method so as to fill the recess 2. In the ALD method as the second method, the Cu-containing source gas and the $H_2$ gas are alternately and repeatedly supplied as depicted in FIG. 9(C). Alternatively, the Cu-containing gas may be intermittently supplied without supplying the $H_2$ gas. Thus, a Cu film can be formed by a simple pyrolysis reaction.

Here, as process conditions (including the CVD method), a process temperature may be set to be in a range of from about 70° C. to about 350° C., and a process pressure may be set to be in a range of from about 1 Pa to about 13 kPa. Further, a flow rate of the Cu-containing source gas may be set to be in a range of from about 1 sccm to about 100 sccm, and a flow rate of the $H_2$ gas may be set to be in a range of from about 5 sccm to about 500 sccm. In particular, in the CVD method or in the ALD method, the thin film may be easily formed on the inner surface of the recess as compared to the plating method. Thus, even if the recess becomes narrower, the recess can be filled without generating a void therein.

The annealing process may be performed to reliably form the Mn barrier film. Thus, if the proceeding process of the annealing process is performed at a high process temperature, that is enough for the self-formation of the Mn barrier film, in a range of, for example, from about 100° C. to about 150° C., the Mn barrier film having a sufficient thickness can be formed. Therefore, the annealing process may become unnecessary. Here, the Cu-containing source gas may include Cu(I)hfac TMVS(copper complex), $Cu(hfac)_2$, and $Cu(dibm)_2$ (see Japanese Patent Laid-open Publication No. 2001-053030).

As described above, in accordance with the first embodiment, when the film is formed on the target object having there on the insulating layer that is made of the low-k film and having the recess whose bottom is exposed to the metallic layer, the second-metal-containing film can be formed efficiently by forming the first-metal-containing film containing the first metal such as Ru serving as the underlying layer before the second-metal-containing film containing the second metal such as Mn, having a barrier property against the filling metal to be filled in the recess is formed.

Since series of the above-described processes can be performed in the same processing system, i.e. performed successively in-situ without being exposed to atmosphere, throughput can be increased, and a film property or the adhesivity can be improved.

<Second Embodiment of Present Disclosure>

Hereinafter, a film forming method of a second embodiment of the present disclosure will be explained. In the first embodiment of the present disclosure, the first-metal-containing film 210 made of the Ru film and the second-metal-containing film 212 made of the MnOx film are layered one by one to form the barrier layer 214. However, the present disclosure is not limited thereto, and the first-metal-containing film 210 and the second-metal-containing film 212 may be layered alternately, and an uppermost film may be the first-metal-containing film 210, so that a barrier layer 214 may be formed as a whole. That is, the first-metal-containing films 210 may be formed one more time. FIG. 10 is an explanatory diagram for explaining the film forming method in accordance with the second embodiment of the present disclosure, and, to be specific, FIG. 10(A) is a flow chart and FIG. 10(B) is a cross sectional view showing a layered structure of a barrier layer. The same components as depicted in FIGS. 6 and 7 are assigned the same reference numerals, and redundant explanations thereof will be omitted.

As depicted in FIG. 10(A), the first-metal-containing film forming process (S1) and the second-metal-containing film forming process (S2) are alternately and repeatedly performed. At this time, the first-metal-containing film forming process (S1) is performed a certain number n of times (yes in S1-1), the filling process (S3) is performed without performing the second-metal-containing film forming process (S2). Herein, "n" is a positive integer equal to or greater than 2 such as 2, 3, 4, 5 . . . FIG. 10(B) shows a case where the certain number (n) is 2 and the barrier layer 214 is configured as a three-layer structure including the single second-metal-containing film (MnOx film or the like) 212 between the two first-metal-containing films (Ru films) 210. Here, the Ru film as the uppermost first-metal-containing film may serve as a seed layer for Cu as a filling metal filled in the recess 2.

Therefore, if the recess 2 is filled by means of a Cu plating process, it is not necessary to form a Cu seed film by means of a sputtering method before filling the recess. The uppermost Ru film as a seed film may be directly plated with Cu. In the second embodiment, the first-metal-containing film and the second-metal-containing film may be alternately and repeatedly formed. In this case, as mentioned above, the uppermost film is the first-metal-containing film 210, and the barrier layer 214 is formed as a whole.

<Third Embodiment of Present Disclosure>

Hereinafter, a film forming method of a third embodiment of the present disclosure will be explained. In the first and second embodiments of the present disclosure, the first-metal-containing film 210 and the second-metal-containing film 212 are layered to form the barrier layer 214. However, the present disclosure is not limited thereto, and an alloy film containing the first-metal, the second metal and the third metal as the filling metal may be formed to form a barrier layer.

Figure 11:
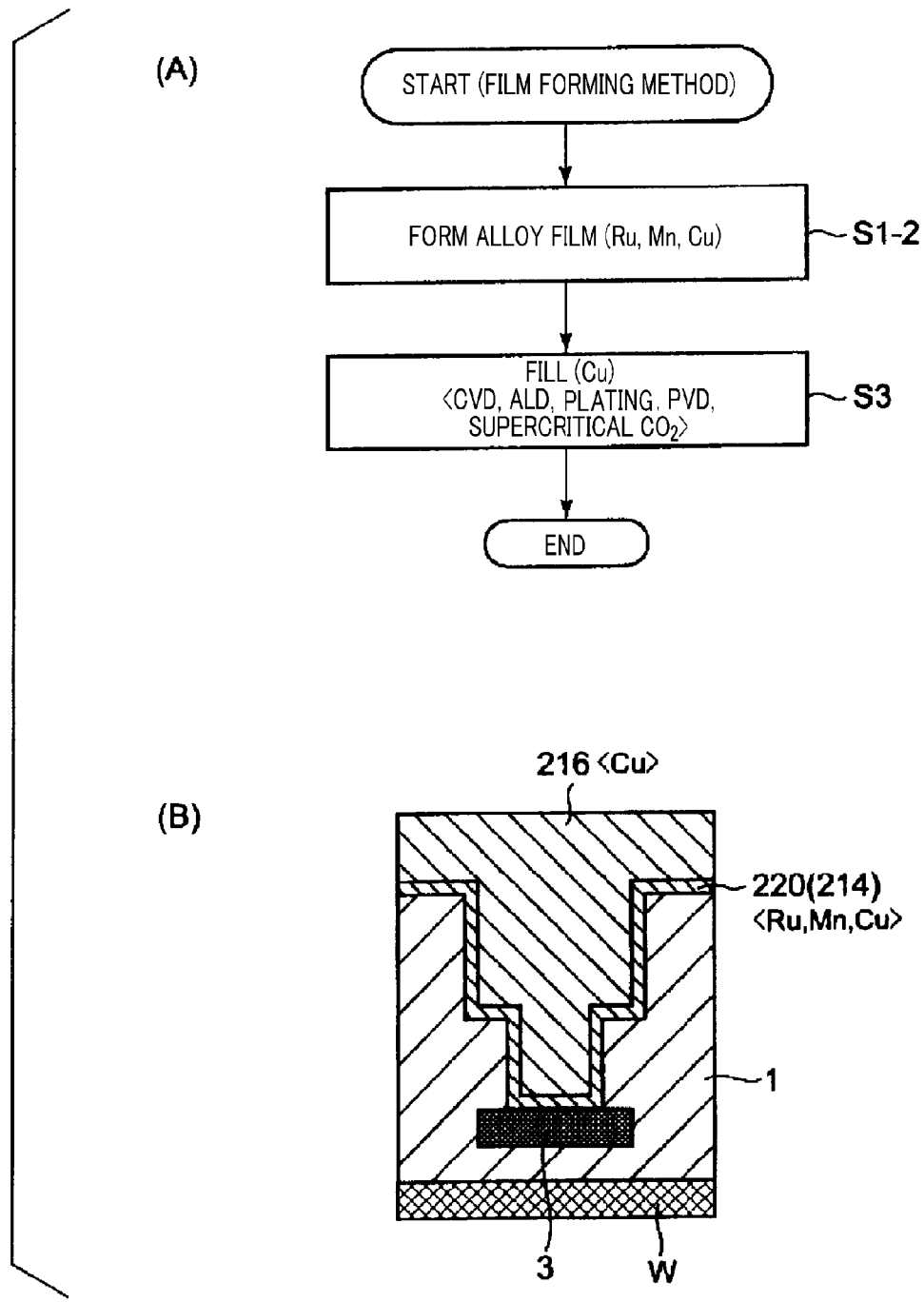
FIG. 11 is an explanatory diagram for explaining a film forming method in accordance with a third embodiment of the present disclosure.

FIG. 11 is an explanatory diagram for explaining a film forming method of a third embodiment of the present disclosure, and, to be specific, FIG. 11(A) is a flow chart and FIG. 11(B) is a cross sectional view showing a configuration of a barrier layer. The same components as depicted in FIGS. 6 and 7 are assigned the same reference numerals, and redundant explanations thereof will be omitted. As depicted in FIGS. 11(A) and 11(B), in the present embodiment, instead of the first-metal-containing film forming process (S1) and the second-metal-containing film forming process (S2), which are performed in the first embodiment, there is performed an alloy film forming process (S1-2) for forming an alloy film containing the first-metal such as Ru; the second metal, such as Mn, having a barrier property against the filling metal to be filled in the recess; and the third metal as a material of the filling metal as described above. An alloy film 220 serves as the barrier layer 214. Since this barrier layer 214 contains therein Mn, it has a barrier property against Cu. Further, since the barrier layer 214 contains therein Cu, it has a seed property with respect to Cu. When a Cu plating process is performed during a post-process, a Cu seed film forming process may be omitted.

This alloy film 220 may be performed by a processing apparatus further including a supply unit for a source gas containing Cu added to the shower head 42 of the fifth processing apparatus 12E depicted in FIG. 5. By this processing apparatus, a barrier layer made of the alloy film including the first metal such as Ru, the second metal such as Mn, and the third metal such as Cu can be formed. In each of the above-described embodiments, Ru is used as the first metal. However, the first metal is not limited thereto, and the first metal may be made of one metal or metal alloy selected from a group consisting of Fe, Co, Ni, Rh, Pd, Os, Ir, Pt, Ti, Ta, Zr, W, Al, V, and Cr.

In each of the above-described embodiments, the film forming method includes the thermal CVD method and the thermal ALD method. However, the film forming method is not limited thereto, and the film forming method may include a plasma CVD method, a plasma ALD method, an optical CVD method and an optical ALD method using ultraviolet rays or laser beams.

Organic metal containing Mn may contain one or more compounds selected from a group consisting of $Cp_2Mn$ [$=Mn(C_5H_5)_2$], $(MeCp)_2Mn[=Mn(CH_3C_5H_4)_2]$, $(EtCp)_2Mn[=Mn(C_2H_5C_5H_4)_2]$, $(i-PrCp)_2Mn[=Mn(C_3H_7C_5H_4)_2]$, $MeCpMn(CO)_3[=(CH_3C_5H_4)Mn(CO)_3]$, $(t-BuCp)_2Mn[=Mn(C_4H_9C_5H_4)_2]$, $CH_3Mn(CO)_5$, $Mn(DPM)_3[=Mn(C_{11}H_{19}O_2)_3]$, $Mn(DMPD)(EtCp)[=Mn(C_7H_{11}C_2H_5C_5H_4)]$, $Mn(acac)_2[=Mn(C_5H_7O_2)_2]$, $Mn(DPM)_2[=Mn(C_{11}H_{19}O_2)_2]$, $Mn(acac)_3[=Mn(C_5H_7O_2)_3]$, $Mn(hfac)_2[=Mn(C_5HF_6O_2)_2]$, $((CH_3)_5Cp)_2Mn[=Mn((CH_3)_5C_5H_4)_2]$, $[Mn(iPr-AMD)_2][=Mn(C_3H_7NC(CH_3)NC_3H_7)_2]$, and $[Mn(tBu-AMD)_2][=Mn(C_4H_9NC(CH_3)NC_4H_9)_2]$. Other than the organic metal, a metal complex may be used.

Herein, there has been explained a case where a SiOC film may be used as a low-k insulating layer 1 serving as an underlying film. However, the material of the insulating layer 1 is not limited to SiOC, and the insulating layer 1 may be made of one or more low-k films selected from a group consisting of a SiOC film, a SiCOH film, a SiCN film, a porous silica film, a porous methyl silsesquioxane film, a polyallylene film, a SiLK (registered trademark) film, and a fluorocarbon film.

Each processing apparatus explained above is just an example. Therefore, by way of example, a heating lamp such as a halogen lamp may be used as a heating unit instead of a resistance heater. The thermal processing apparatus may include a single-wafer processing apparatus and a batch type processing apparatus.

The film formation method is not limited to the heat treatment method. By way of example, the shower head 42 or 134 may serve as an upper electrode while a mounting table 156 may serve as a lower electrode. With this configuration, plasma may be generated by applying high frequency power between the two electrodes. Further, it may be possible to allow the plasma to assist in the film formation. Until now, the semiconductor wafer has been described as a target object, but the target object is not limited thereto. The present disclosure can employ a glass substrate, a LCD substrate, and a ceramic substrate.

In accordance with the film forming method of the present disclosure, even if various large and small trenches and holes is provided on a semiconductor wafer, it may be possible to form a sufficiently thin and uniform barrier layer on the entire part of such recesses. For this reason, the present disclosure can be applied from a lower local wiring to an upper global wiring in a Cu multilayer wiring, so that the Cu multilayer wiring can be scaled down. Thus, it may be possible to achieve high speed and scaling-down of a semiconductor device. Accordingly, it may be possible to manufacture a small-sized high speed electronic apparatus with reliability.

What is claimed is:

1. A film forming method for forming a film on a target object having thereon an insulating layer that is made of a low-k film and having a recess whose bottom surface is exposed to a metallic layer, the method comprising:
   forming a first-metal-containing film containing a first metal; and
   after forming the first-metal-containing film, forming a second-metal-containing film containing a second metal having a barrier property against a filling metal to be filled in the recess, the second metal being different from the first metal,
   wherein the forming of the second-metal-containing film involves a reaction of the second metal with oxygen components of the insulating layer that penetrate through the first-metal-containing film, and
   the second-metal-containing film positioned at a bottom of the recess above the metallic layer is not oxidized.

2. The film forming method of claim 1,
   wherein the forming of the first-metal-containing film and the forming of the second-metal-containing film are performed alternately, and, in addition to the alternate formations, the forming of the first-metal-containing film is additionally performed.

3. A film forming method for forming a film on a target object having thereon an insulating layer that is made of a low-k film and having a recess whose bottom is exposed to a metallic layer, the method comprising:

forming an alloy film containing a first metal, a second metal having a barrier property against a filling metal to be filled in the recess, and a third metal as a material of the filling metal, the second metal being different from the first metal, wherein the second metal reacts with oxygen components of the insulating layer that penetrate through the first metal, and the second metal positioned at a bottom of the recess above the metallic layer is not oxidized.

4. The film forming method of claim 1 or claim 2, wherein the forming of the first-metal-containing film is performed and, subsequently, the forming of the second-metal-containing film is performed in a same processing chamber.

5. The film forming method of any one of claims 1 to 3, further comprising:

filling the recess with the filling metal.

6. The film forming method of any one of claims 1 to 3, wherein the low-k film is made of one or more films selected from a group consisting of a SiOC film, a SiCOH film, a SiCN film, a porous silica film, a porous methyl silsesquioxane film, a polyallylene film, and a fluorocarbon film.

7. The film forming method of any one of claims 1 to 3, wherein the first metal is made of one or more elements selected from a group consisting of Ru, Fe, Co, Ni, Rh, Pd, Os, Ir, Pt, Ti, Ta, Zr, W, Al, V, and Cr.

8. The film forming method of claim 1 or claim 2, wherein in the forming of the second-metal-containing film, one or more compounds selected from a group consisting of $Cp_2Mn[=Mn(C_5H_5)_2]$, $(MeCp)_2Mn[=Mn(CH_3C_5H_4)_2]$, $(EtCp)_2Mn[=Mn(C_2H_5C_5H_4)_2]$, $(i\text{-}PrCp)_2Mn[=Mn(C_3H_7C_5H_4)_2]$, $MeCpMn(CO)_3[=(CH_3C_5H_4)Mn(CO)_3]$, $(t\text{-}BuCp)_2Mn[=Mn(C_4H_9C_5H_4)_2]$, $CH_3Mn(CO)_5$, $Mn(DPM)_3[=Mn(C_{11}H_{19}O_2)_3]$, $Mn(DMPD)(EtCp)[=Mn(C_7H_{11}C_2H_5C_5H_4)]$, $Mn(acac)_2[=Mn(C_5H_7O_2)_2]$, $Mn(DPM)_2[=Mn(C_{11}H_{19}O_2)_2]$, $Mn(acac)_3[=Mn(C_5H_7O_2)_3]$, $Mn(hfac)_2[=Mn(C_5HF_6O_2)_3]$, $((CH_3)_5Cp)_2Mn[=Mn((CH_3)_5C_5H_4)_2]$, $[Mn(iPr\text{-}AMD)_2][=Mn(C_3H_7NC(CH_3)NC_3H_7)_2]$, and $[Mn(tBu\text{-}AMD)_2][=Mn(C_4H_9NC(CH_3)NC_4H_9)_2]$ are used as materials.

9. The film forming method of any one of claims 1 to 3, wherein the filling metal is copper.

10. A barrier layer formed in a recess of a target object having thereon an insulating layer that is made of a low-k film and having the recess whose bottom is exposed to a metallic layer, the barrier layer being positioned below a filling metal to be filled in the recess, the barrier layer comprising:

a first-metal-containing film containing a first metal; and a second-metal-containing film containing a second metal having a barrier property against the filling metal to be filled in the recess, the second metal being different from the first metal, wherein the second metal reacts with oxygen components of the insulating layer that penetrate through the first-metal-containing film, and the second-metal-containing film positioned at a bottom of the recess above the metallic layer is not oxidized.

11. The barrier layer of claim 10, wherein the first-metal-containing film and the second-metal-containing film are layered alternately, and an uppermost film is the first-metal-containing film.

12. A barrier layer formed in a recess of a target object having thereon an insulating layer that is made of a low-k film and having the recess whose bottom is exposed to a metallic layer, the barrier layer being positioned below a filling metal to be filled in the recess, the barrier layer comprising:

an alloy film containing a first metal, a second metal having a barrier property against the filling metal to be filled, and a third metal as a material of the filling metal to be filled, the second metal being different from the first metal, wherein the second metal reacts with oxygen components of the insulating layer that penetrate through the first metal, and the second metal positioned at a bottom of the recess above the metallic layer is not oxidized.

* * * * *